US010096581B2

(12) United States Patent
Maki

(10) Patent No.: US 10,096,581 B2
(45) Date of Patent: Oct. 9, 2018

(54) LIGHT EMITTING MODULE

(71) Applicant: TOSHIBA HOKUTO ELECTRONICS CORPORATION, Asahikawa-Shi (JP)

(72) Inventor: Keiichi Maki, Asahikawa (JP)

(73) Assignee: Toshiba Hokuto Electronics Corporation, Asahikawa-Shi (JP)

( * ) Notice: Subject to any disclaimer, the term of this patent is extended or adjusted under 35 U.S.C. 154(b) by 0 days.

(21) Appl. No.: 15/268,961

(22) Filed: Sep. 19, 2016

(65) Prior Publication Data
US 2017/0012027 A1 Jan. 12, 2017

Related U.S. Application Data

(63) Continuation of application No. PCT/JP2015/004814, filed on Sep. 18, 2015.

(30) Foreign Application Priority Data

Sep. 26, 2014 (JP) .................... 2014-196379
Apr. 28, 2015 (JP) .................... 2015-092055

(51) Int. Cl.
*H01L 25/075* (2006.01)
*H01L 33/52* (2010.01)
(Continued)

(52) U.S. Cl.
CPC ........ *H01L 25/0753* (2013.01); *H01L 33/504* (2013.01); *H01L 33/52* (2013.01);
(Continued)

(58) Field of Classification Search
CPC ....... H01L 33/52; H01L 33/56; H01L 33/504; H01L 33/62; H01L 25/0753
See application file for complete search history.

(56) References Cited

U.S. PATENT DOCUMENTS 7,478,925 B2  1/2009  Hiyama et al.
7,878,680 B2  2/2011  Fujino et al.
(Continued)

FOREIGN PATENT DOCUMENTS

JP    60-262430 A1   12/1985
JP    61-006833 A1   1/1986
(Continued)

OTHER PUBLICATIONS

U.S. Appl. No. 15/078,321, filed Mar. 23, 2016, Maki, Keiichi.
(Continued)

*Primary Examiner* — Christine Enad
(74) *Attorney, Agent, or Firm* — Burr & Brown, PLLC

(57) ABSTRACT

A light emitting module according to an embodiment includes a first insulation film with a light transmissivity, a second insulation film disposed so as to face the first insulation film, a first double-sided light emitting element disposed between the first insulation film and the second insulation film, and including a pair of electrodes on one surface, a second double-sided light emitting element disposed between the first insulation film and the second insulation film adjacent to the first double-sided light emitting element, comprising a pair of electrodes on one surface, and emitting different light from the first double-sided light emitting element, and a conductor pattern formed on a surface of the first insulation film, and connected to the respective electrodes of the first double-sided light emitting element and the second double-sided light emitting element.

31 Claims, 23 Drawing Sheets

(51) Int. Cl.
*H01L 33/62* (2010.01)
*H01L 33/50* (2010.01)
*H01L 33/56* (2010.01)

(52) U.S. Cl.
CPC .............. *H01L 33/56* (2013.01); *H01L 33/62* (2013.01); *H01L 2224/16225* (2013.01); *H01L 2933/0041* (2013.01); *H01L 2933/0066* (2013.01)

(56) References Cited

U.S. PATENT DOCUMENTS

| | | |
|---|---|---|
| 7,952,107 B2 | 5/2011 | Daniels et al. |
| 8,044,415 B2 | 10/2011 | Messere et al. |
| 9,306,132 B2 | 4/2016 | Maki |
| 2006/0092634 A1 | 5/2006 | Hiyama et al. |
| 2008/0143916 A1 | 6/2008 | Fujino et al. |
| 2009/0114928 A1* | 5/2009 | Messere ................. B32B 17/10 257/88 |
| 2014/0209943 A1* | 7/2014 | Yamamoto .......... H01L 25/0753 257/89 |
| 2014/0232289 A1* | 8/2014 | Brandes ............... H05B 33/086 315/250 |
| 2015/0249069 A1* | 9/2015 | Yoshida .................. H01L 33/62 257/89 |
| 2016/0013376 A1 | 1/2016 | Maki |
| 2016/0027973 A1 | 1/2016 | Maki |
| 2016/0155913 A1 | 6/2016 | Maki |
| 2016/0233399 A1 | 8/2016 | Maki |

FOREIGN PATENT DOCUMENTS

| | | |
|---|---|---|
| JP | 61-194732 A1 | 8/1986 |
| JP | 07-122787 A1 | 5/1995 |
| JP | 09-167861 A1 | 6/1997 |
| JP | 11-145381 A1 | 5/1999 |
| JP | 11-177147 A1 | 7/1999 |
| JP | 2000-227952 A1 | 8/2000 |
| JP | 2000-299411 A1 | 10/2000 |
| JP | 2002-082635 A1 | 3/2002 |
| JP | 2002-246418 A1 | 8/2002 |
| JP | 2006-134992 A1 | 5/2006 |
| JP | 2007/149362 A2 | 12/2007 |
| JP | 2008-028171 A1 | 2/2008 |
| JP | 2008-034473 A1 | 2/2008 |
| JP | 2009-512977 A1 | 3/2009 |
| JP | 2011-134926 A1 | 7/2011 |
| JP | 2011-205142 A1 | 10/2011 |
| JP | 2011-228463 A1 | 11/2011 |
| JP | 2012-084855 A1 | 4/2012 |
| JP | 2013-254990 A1 | 12/2013 |
| JP | 5533183 B2 | 6/2014 |
| WO | 2005/099310 A2 | 10/2005 |
| WO | 2008/051596 A2 | 5/2008 |
| WO | 2014/156159 A1 | 10/2014 |
| WO | 2014/157455 A1 | 10/2014 |
| WO | 2015/068344 A1 | 5/2015 |
| WO | 2015/083364 A1 | 6/2015 |
| WO | 2015/083365 A1 | 6/2015 |
| WO | 2015/083366 A1 | 6/2015 |

OTHER PUBLICATIONS

U.S. Appl. No. 15/077,143, filed Mar. 22, 2016, Maki, Keiichi.
U.S. Appl. No. 15/078,404, filed Mar. 23, 2016, Maki, Keiichi.
International Search Report and Written Opinion (Application No. PCT/JP2015/004814) dated Dec. 1, 2015.

* cited by examiner

LIGHT EMITTING MODULE

CROSS-REFERENCE TO RELATED APPLICATION

This application is a continuation of prior International Application No. PCT/JP2015/004814 filed on Sep. 18, 2015, which is based upon and claims the benefit of priority from Japanese Patent Applications No. 2014-196379 filed on Sep. 26, 2014, and No. 2015-092055 filed on Apr. 28, 2015, the entire contents of all of which are incorporated herein by reference.

FIELD

Embodiments of the present disclosure relate to a light emitting module.

BACKGROUND

In recent years, efforts for decreasing an energy consumption amount are emphasized. In view of such a background, Light Emitting Diodes (LEDs) that have a relatively little power consumption are getting attention as a next-generation light source. LEDs are compact, have a little amount of heat generation, and have an excellent responsiveness. Hence, LEDs are widely applied in various optical devices. For example, in recent years, a module that has a right source which is LEDs arranged on a flexible and light transmissive substrate has been proposed.

Lights from LEDs are monochromatic color lights, such as Red (R), Green (G), and Blue (B). Hence, in order to accomplish a white light and an intermediate-color light using a light source that includes LEDs, it is necessary to use multiple LEDs that emit different color lights.

DETAILED DESCRIPTION

A light emitting module according to the present disclosure includes a first insulation film with a light transmissivity, a second insulation film disposed so as to face the first insulation film, a first double-sided light emitting element disposed between the first insulation film and the second insulation film, and comprising a pair of electrodes on one surface, a second double-sided light emitting element disposed between the first insulation film and the second insulation film adjacent to the first double-sided light emitting element, comprising a pair of electrodes on one surface, and emitting different light from the first double-sided light emitting element, and a conductor pattern formed on a surface of the first insulation film, and connected to the respective electrodes of the first double-sided light emitting element and the second double-sided light emitting element.

First Embodiment

A first embodiment of the present disclosure will be explained with reference to the figures. As for the explanation, an XYZ coordinate system that has the X axis, the Y axis and the Z axis orthogonal to one another is adopted.

Figure 1:
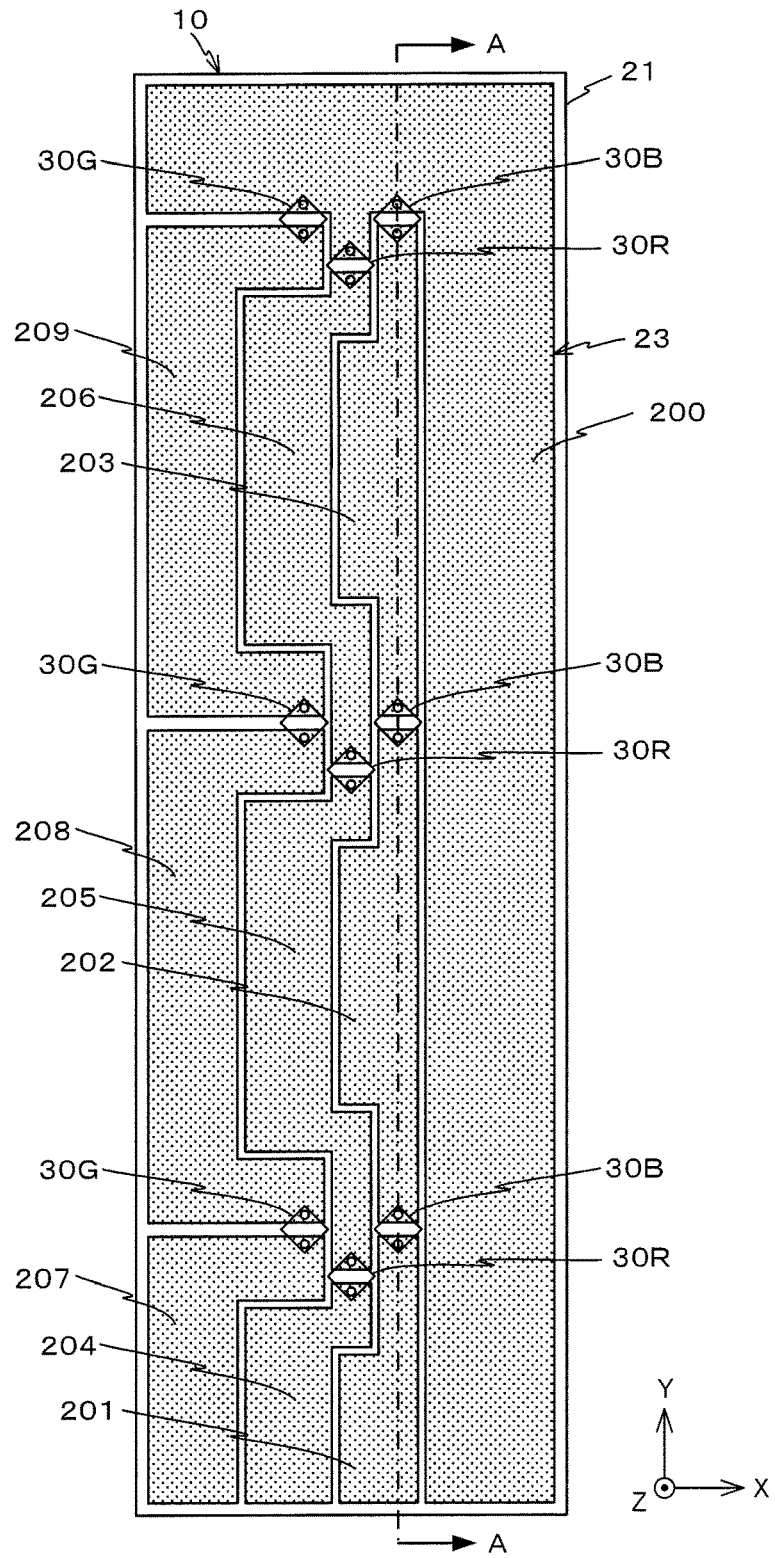
FIG. 1 is a plan view illustrating a light emitting module according to an embodiment.

FIG. 1 is a plan view of the light emitting module 10 according to this embodiment. As illustrated in FIG. 1, a light emitting module 10 is a module that has the lengthwise direction which is in the Y-axis direction. This light emitting module 10 has a light source that includes light emitting elements 30R, 30G, and 30B of three colors arranged adjacent to each other.

Figure 2:
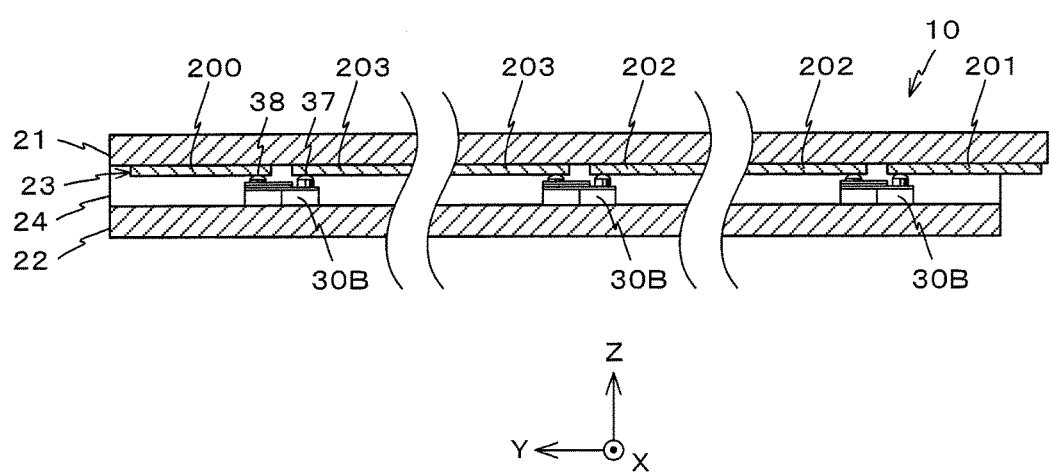
FIG. 2 is a diagram illustrating a cross-section of the light emitting module.

FIG. 2 is a diagram illustrating a cross-section of the light emitting module 10 in FIG. 1 taken along a line A-A. As is clear from FIG. 2, the light emitting module 10 includes a pair of light transmissive films 21, 22, a resin layer 24 formed between the light transmissive films 21, 22, and the light emitting elements 30R, 30G, and 30B arranged in the resin layer 24. Note that FIG. 2 illustrates only the light emitting elements 30B.

The light transmissive films 21, 22 are each a rectangular film that has the lengthwise direction which is in the Y-axis direction. The light transmissive films 21, 22 each have a thickness of substantially 50-300 µm, and have a transmissivity for visible light. It is preferable that the total light beam transmissivity of the light transmissive film 21, 22 should be substantially 5-95%. Note that the term total light beam transmissivity means a total light beam transmissivity measured in compliance with Japanese Industrial Standards JISK7375:2008.

The light transmissive films 21, 22 are flexible, and the bending elastic modulus is substantially 0-320 kgf/mm² (other than zero). Note that the bending elastic modulus is a value measured by a method in compliance with ISO178 (JIS K7171:2008).

Example materials of the light transmissive films 21, 22 are polyethylene-terephthalate (PET), polyethylene-naphthalate (PEN), polycarbonate (PC), polyethylene-succinate (PES), arton (ARTON), and an acrylic resin.

In the pair of light transmissive films 21, 22, a conductor layer 23 that has a thickness of substantially 0.05-10 µm is formed on the lower surface of the light transmissive film 21 (the surface at the −Z side in FIG. 2). For example, the conductor layer 23 is a deposited film or a sputtered film. The conductor layer 23 may be a pasted metal film by an adhesive. When the conductor layer 23 is a deposited film or a sputtered film, the conductor layer 23 has a thickness of substantially 0.05-2 µm. When the conductor layer 23 is a pasted metal film, the conductor layer 23 has a thickness of substantially 2-10 µm or 2-7 µm.

As illustrated in FIG. 1, the conductor layer 23 includes an L-shaped mesh pattern 200 formed along the outer edge of the light transmissive film 21 at the +X side, mesh patterns 201, 202, 203 arranged along the outer edge of the mesh pattern 200 at the −X side, mesh patterns 204, 205, 206 disposed at the respective −X sides of the mesh patterns 201-203, and mesh patterns 207, 208, 209 disposed at the respective −X sides of the mesh patterns 204-206. The mesh patterns 200-209 are each formed of a metal, such as copper (Cu) or gold (Au).

Figure 3:
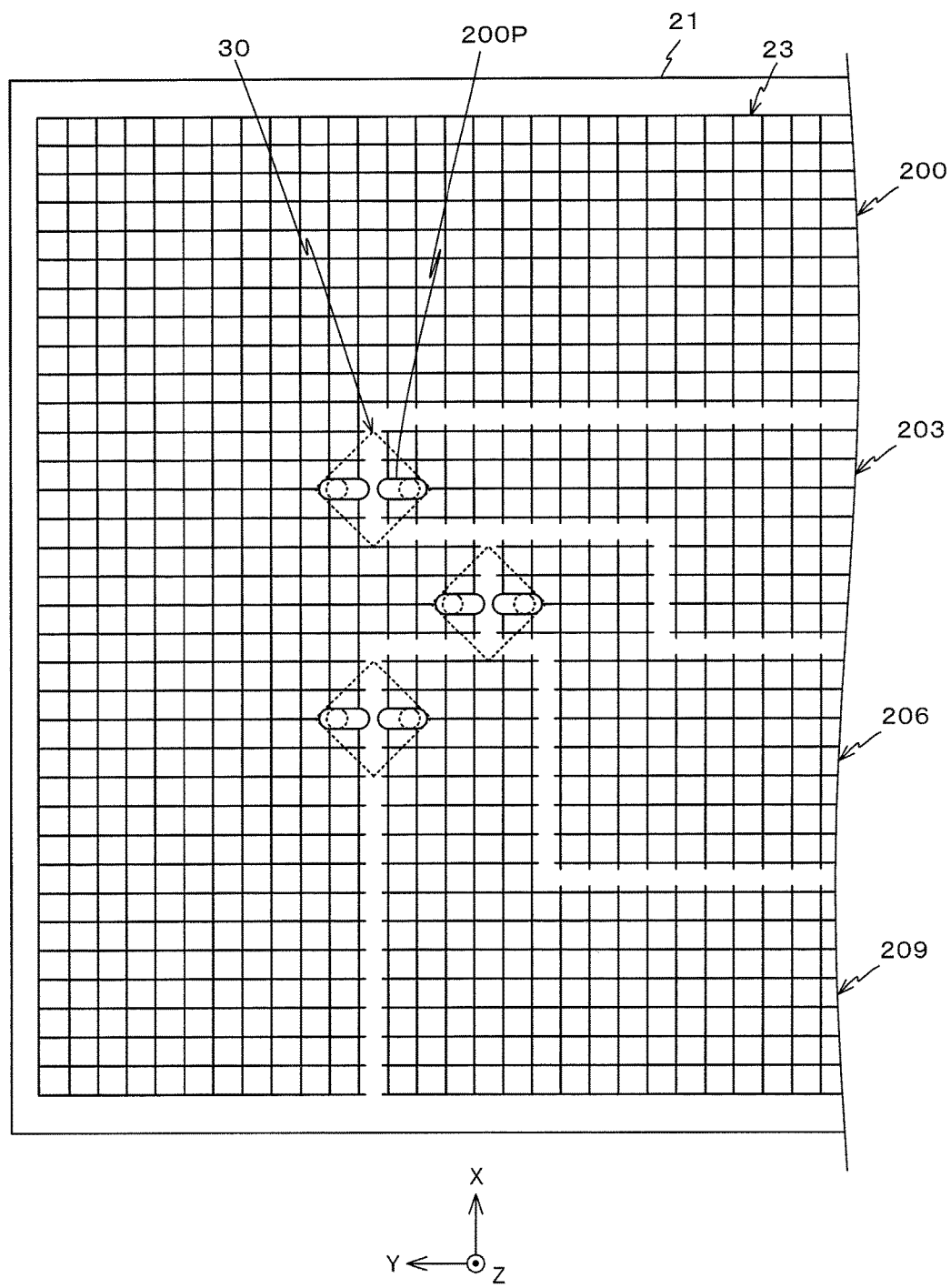
FIG. 3 is a diagram illustrating a part of a mesh pattern forming a conductor layer in an enlarged manner.

FIG. 3 is a diagram illustrating the mesh patterns 200, 203, 206, 209 in a partially enlarged manner. As illustrated in FIG. 3, the mesh patterns 200-209 are each line patterns that have a line width of substantially 10 µm. The line patterns in parallel with the X-axis direction are formed at the pitch of substantially 300 µm along the Y-axis direction. In addition, the line patterns in parallel with the Y-axis direction are formed at the pitch of substantially 300 µm along the X-axis direction. Each mesh pattern 200-209 is formed with a connection pad 200P connected to the electrode of the light emitting element 30R, 30G, and 30B.

As illustrated in FIG. 2, the light emitting module 10 has the lower light transmissive film 22 that is shorter than the light transmissive film 21 in the Y-axis direction. Hence, the respective −Y-side ends of the mesh patterns 200, 201, 204, and 207 that form the conductor layer 23 are exposed.

The resin layer 24 is formed between the light transmissive films 21, 22. The resin layer 24 has a transmissivity to visible light.

Each of the light emitting elements 30R, 30G, and 30B is a square LED chip that has a side of substantially 0.1-3 mm. In order to simplify the explanation, the light emitting elements 30R, 30B, and 30G are collectively referred to as a light emitting element 30 as appropriate below. In this embodiment, the light emitting elements 30R, 30G, and 30B are each a bare chip.

Figure 4:
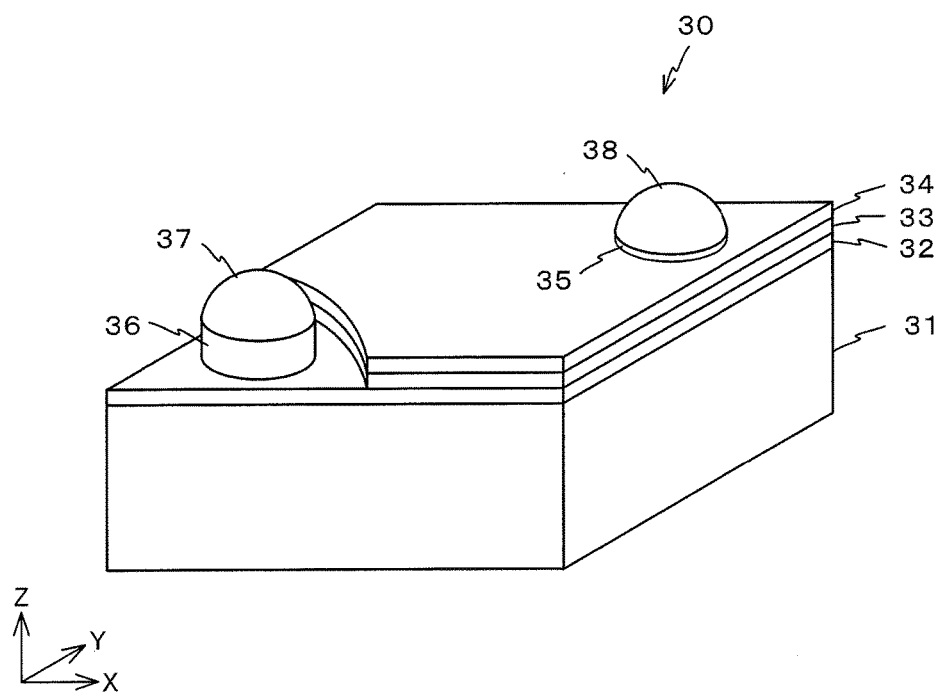
FIG. 4 is a perspective view illustrating a light emitting element.

As illustrated in FIG. 4, the light emitting element 30 is a four-layer-structure LED chip that includes a base substrate 31, an N-type semiconductor layer 32, an active layer 33, and a P-type semiconductor layer 34. The rated voltage of the light emitting element 30 is substantially 2.5 V.

The base substrate 31 is, for example, a square tabular substrate formed of sapphire. The N-type semiconductor layer 32 in the same shape as that of the base substrate 31 is formed on the upper surface of the base substrate 31. In addition, the active layer 33, the P-type semiconductor layer 34 are laminated in sequence on the upper surface of the N-type semiconductor layer 32. The N-type semiconductor layer 32, the active layer 33, and the P-type semiconductor layer 34 are each formed of a compound semiconductor material. For example, in the case of the light emitting element that emits red light, an InAlGaP-based material is applicable as the active layer. In addition, in the cases of the light emitting elements that emit blue and green lights, a GaN-based semiconductor material is applicable to the P and N type semiconductor layers 34, 32 and an InGaN-based semiconductor material is applicable to the active layer 33, respectively. In any cases, the active layer may employ a Double-Hetero (DH) junction structure, or a Multi-Quantum Well (MQW) structure. In addition, a PN junction structure is also applicable.

The active layer 33, and the P-type semiconductor layer 34 laminated on the N-type semiconductor layer 32 have respective notches formed at the corner portions at the −Y side and also the −X side. The surface of the N-type semiconductor layer 32 is exposed via the notches of the active layer 33 and the P-type semiconductor layer 34.

The region of the N-type semiconductor layer 32 exposed from the active layer 33 and the P-type semiconductor layer 34 is formed with a pad 36 electrically connected to the N-type semiconductor layer 32. In addition, a pad 35 that is electrically connected to the P-type semiconductor layer 34 is formed at the corner portion of the P-type semiconductor layer 34 at the +X side and also the +Y side. The pads 35, 36 are formed of copper (Cu) or gold (Au), and bumps 37, 38 are formed on the respective upper surfaces. The bumps 37, 38 are each a metal bump formed of gold (Au) or a gold alloy. A solder bump formed in a semi-spherical shape may be applied instead of the metal bump. In the light emitting element 30, the bump 37 serves as a cathode electrode, while the bump 38 serves as an anode electrode.

In this embodiment, the light emitting element 30R emits red light. In addition, the light emitting element 30G emits green light, and the light emitting element 30B emits blue light. More specifically, the light emitting element 30R emits light that has a peak wavelength of 600-700 nm or so. In addition, the light emitting element 30G emits light that has a peak wavelength of 500-550 nm or so. Still further, the light emitting element 303 emits light that has a peak wavelength of 450-500 nm or so.

Figure 5:
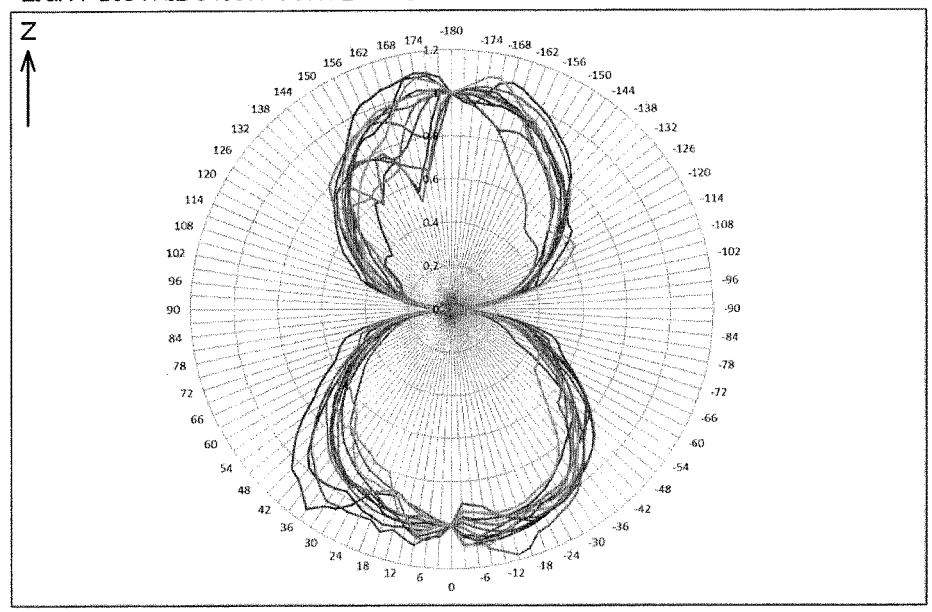
FIG. 5 is a diagram illustrating a light distribution curve of the light emitting element.
Figure 6:
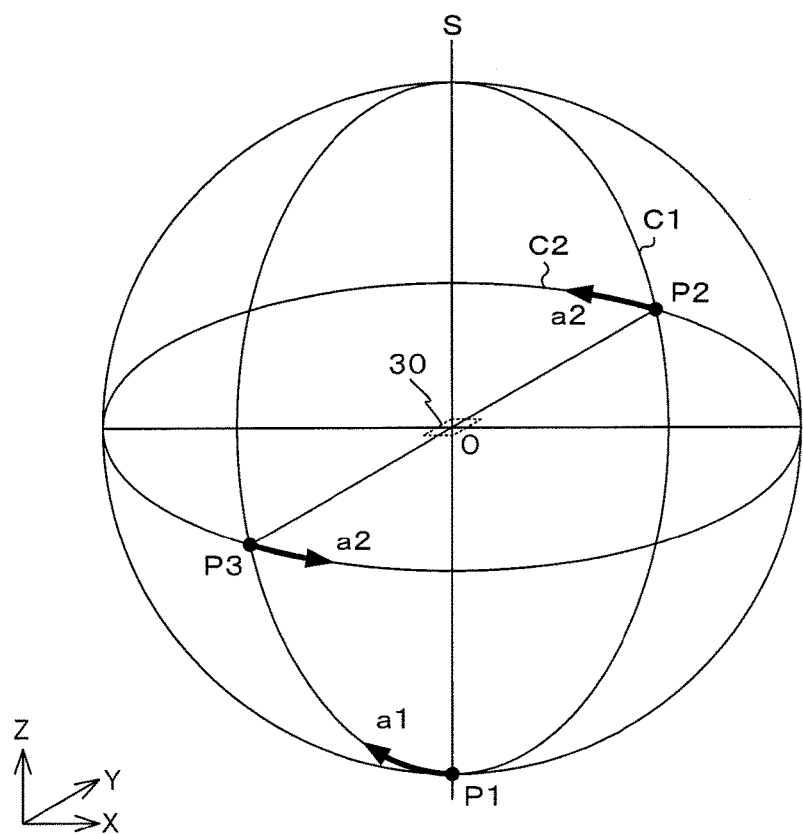
FIG. 6 is a diagram for explaining a sampling scheme for a light distribution curve.

FIG. 5 is a diagram illustrating a light distribution curve of the light emitting element 30R. The term light distribution curve in this case means, as illustrated in FIG. 6, a curve obtained by performing sampling on the light emission intensity at a point on a circle C1 while moving from a point P1 in the direction indicated by an arrow a1 with the light emitting element 30 being disposed at a point O. The circle C1 is a circle that has the point O as a center, and intersects a vertical axis S that passes through the point O. This circle C1 is defined by two points P2, P3 on a circle C2 located on an XY plane with the point O being as a center. In this embodiment, the points P2, P3 are moved in a direction indicated by an arrow a2 in FIG. 6 15 degrees by 15 degrees to define the circle C1 in sequence, and sampling for the light distribution curve is performed for each circle C1. Hence, the light emitting element 30R has 12 light distribution curves.

As indicated by the light distribution curve in FIG. 5, it is clear that the light emitting element 30R emits light from the front surface (+Z-side surface) and the back surface (−Z-side surface). The light from the upper surface of the light emitting element 30R is affected by the pads 35, 36 formed on the upper surface of the light emitting element 30, and then the bumps 37, 38 that have a height. Hence, there is a site where the light emission intensity is slightly low above the light emitting element 30R.

Figure 7:
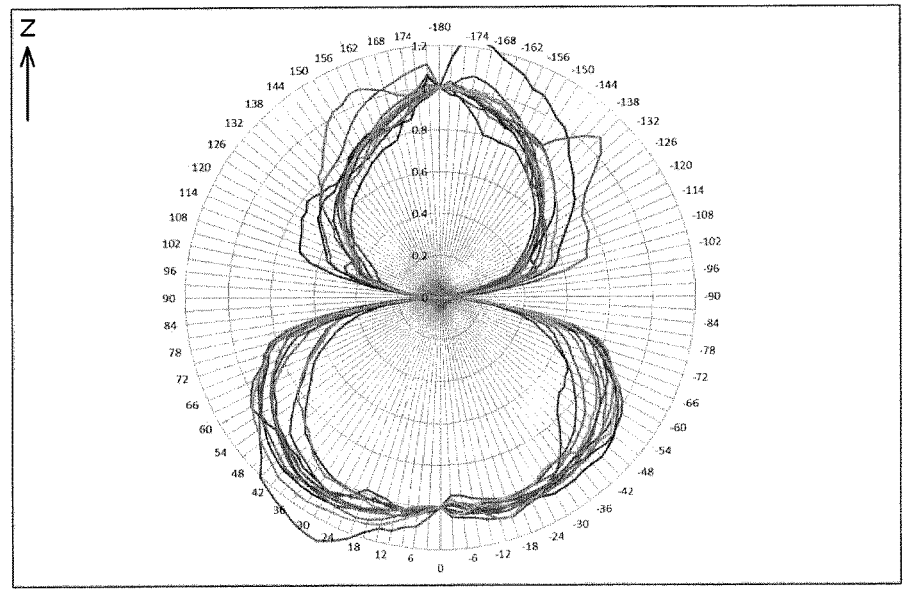
FIG. 7 is a diagram illustrating a light distribution curve of the light emitting element.
Figure 8:
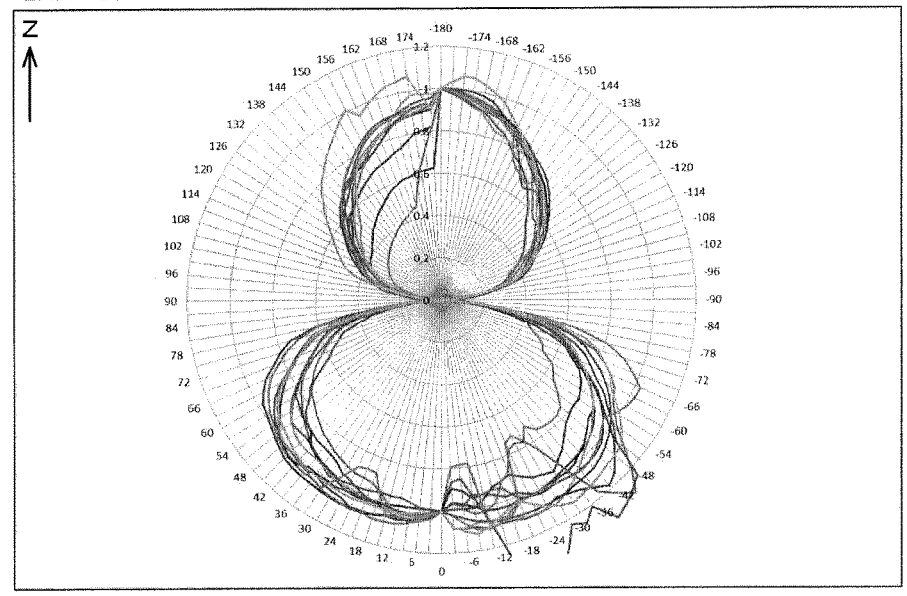
FIG. 8 is a diagram illustrating a light distribution curve of the light emitting element.

FIG. 7 is a diagram illustrating a light distribution curve of the light emitting element 30G, and FIG. 8 is a diagram illustrating a light distribution curve of the light emitting element 30B. As is indicated in FIGS. 7, 8, like the light emitting element 30R, the light emitting elements 30G, 30B emit light from the front surface (+Z-side surface) and the back surface (−Z-side surface). The light from the upper surface of the light emitting element 30G, 30B is affected by the pads 35, 36 and the bumps 37, 38. Hence, there is a site where the light emission intensity is slightly low above the light emitting element 30G, 30B.

As illustrated in FIG. 3, the light emitting elements 30R, 30G, and 30B each have the bumps 37, 38 connected to the connection pads 200P formed on the respective mesh patterns 200-209, thus disposed between the two mesh patterns.

As illustrated in FIG. 1, according to the light emitting module 10, the three light emitting elements 30R are disposed between the mesh pattern 204 and the mesh pattern 205, between the mesh pattern 205 and the mesh pattern 206, and between the mesh pattern 206 and the mesh pattern 200, respectively. In addition, the three light emitting elements 30G are disposed between the mesh pattern 207 and the mesh pattern 208, between the mesh pattern 208 and the mesh pattern 209, and between the mesh pattern 209 and the mesh pattern 200, respectively. Still further, the three light emitting elements 30B are disposed between the mesh pattern 201 and the mesh pattern 202, between the mesh pattern 202 and the mesh pattern 203, and between the mesh pattern 203 and the mesh pattern 200, respectively.

Hence, the light emitting elements 30R, the mesh patterns 200, 204-206 are connected in series. Likewise, the light emitting elements 30G, the mesh patterns 200, 207-209 are connected in series, and the light emitting elements 30B, the mesh patterns 200, 201-203 are connected in series.

Figure 9:
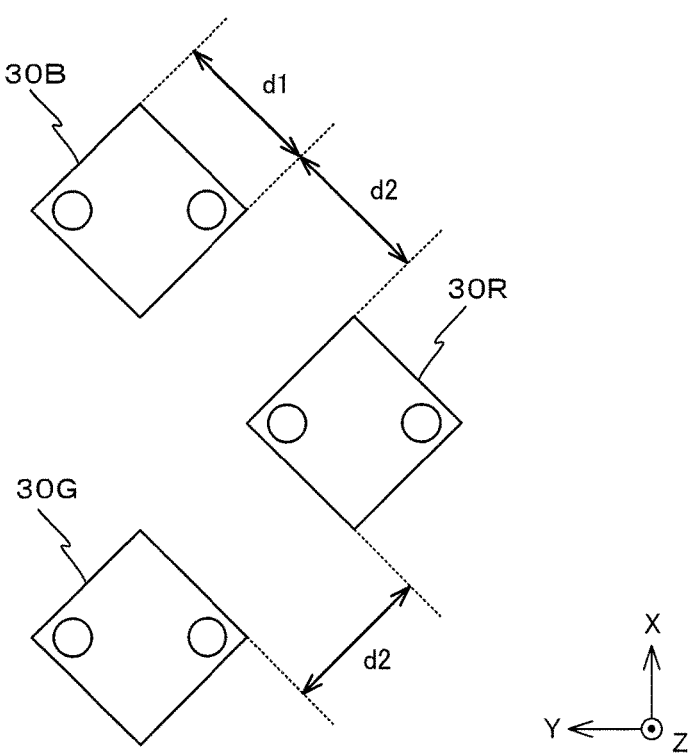
FIG. 9 is a diagram illustrating an arrangement of the light emitting element.

FIG. 9 is a diagram illustrating a positional relationship among the light emitting elements 30R, 30G, and 30B disposed on the mesh patterns 200-209. As illustrated in FIG. 9, each light emitting element 30R, 30G, 30B is arranged adjacent to each other in such a way that a distance d2 to the adjacent light emitting element 30R, 30G, and 30B becomes equal to or shorter than a width d1 of the light emitting element 30R, 30G, and 30B.

When the light emitting elements 30R, 30G, and 30B arranged adjacent to each other have different sizes, the light emitting elements 30R, 30G, and 30B are arranged in such a way that the distance d2 between the adjacent light emitting elements becomes equal to or shorter than the width d1 of the larger light emitting element in the adjacent light emitting elements. Alternatively, the light emitting elements 30R, 30G, and 303 are arranged in such a way that the distance d2 between the adjacent light emitting elements 30R, 30G, and 30B becomes equal to or shorter than the width d1 of the largest light emitting element 30R, 30G, and 30B. The light emitting elements 30R, 30G, and 30B may each be a rectangular that has a ratio of a short side relative to a long side which is, for example, 1:1 to 1:1.5, and the ratio other than 1:1 is adopted, the short side may be defined as the width d1 of the light emitting element.

Figure 10:
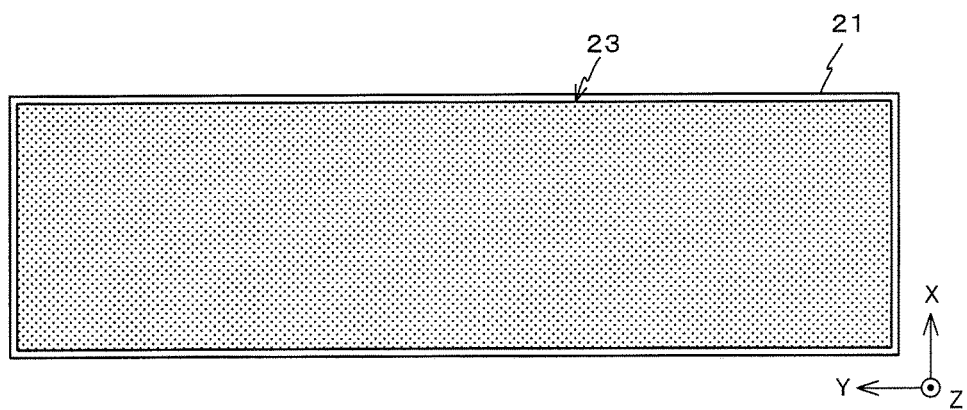
FIG. 10 is a diagram for explaining a manufacturing method of the light emitting module.
Figure 11:
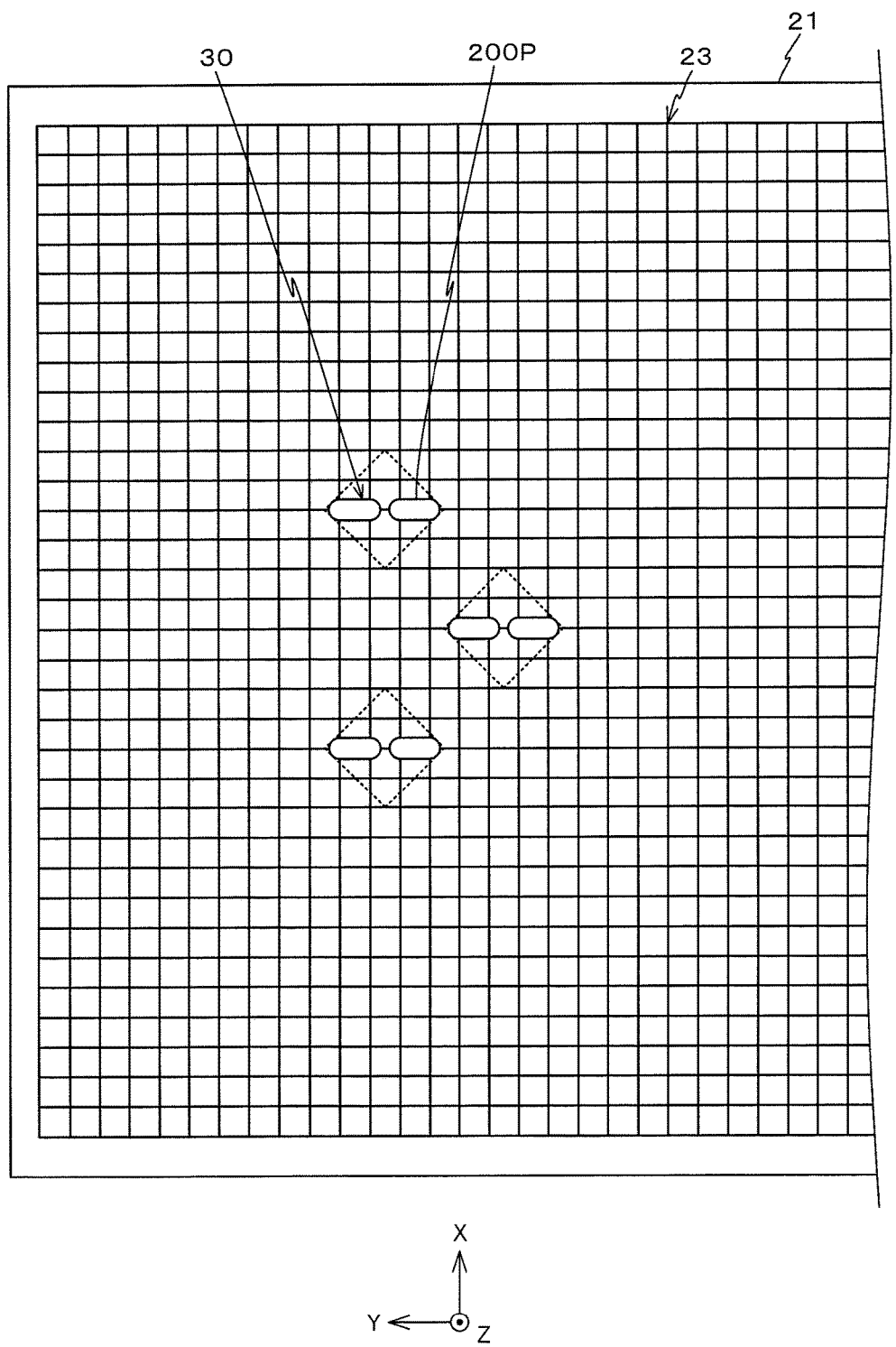
FIG. 11 is a diagram for explaining the manufacturing method of the light emitting module.

Next, a method of manufacturing the above-explained light emitting module 10 will be explained. First, the light transmissive film 21 formed of PET is prepared. Next, as illustrated in FIG. 10, the conductor layer 23 in a mesh shape is formed on the entire surface of the light transmissive film 21 by, for example, a subtract technique or an additive technique. FIG. 11 is a diagram illustrating a part of the conductor layer 23 in an enlarged manner. As illustrated in FIG. 11, in the conductor layer 23 at this stage, portions that will be the mesh patterns 200-209 are formed integrally. In addition, the connection pads 200P which are respective width increasing portions of the mesh patterns are formed on the conductor layer 23 on which the light emitting elements 30R, 30G, and 30B are to be mounted.

Next, this conductor layer 23 is cut by energy beam, in this embodiment, laser to form the mesh patterns 200-209. As for the cutting of the conductor layer 23, laser light is emitted to the conductor layer 23 formed on the surface of the light transmissive film 21. Next, the laser spot of the laser light is moved along dashed lines illustrated in FIG. 12. Hence, the conductor layer 23 is cut along the dashed lines, and as illustrated in FIG. 13, the mesh patterns 200-209 are formed.

Figure 12:
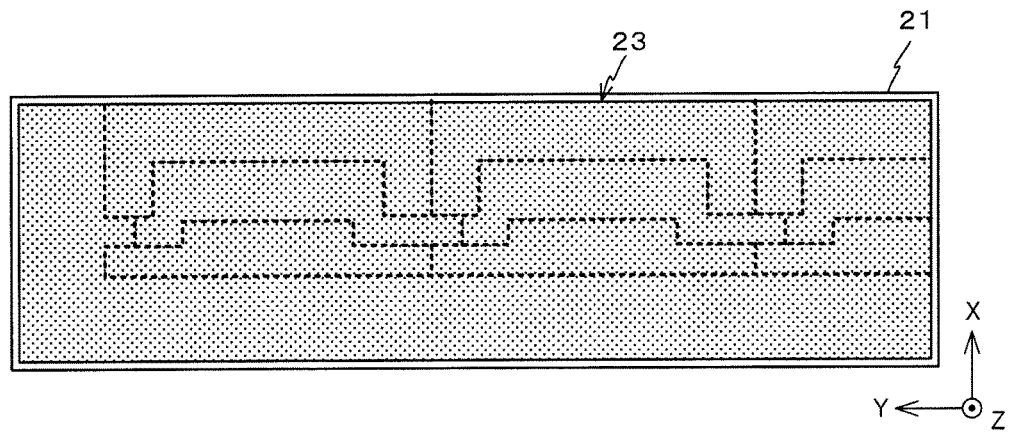
FIG. 12 is a diagram for explaining the manufacturing method of the light emitting module.
Figure 13:
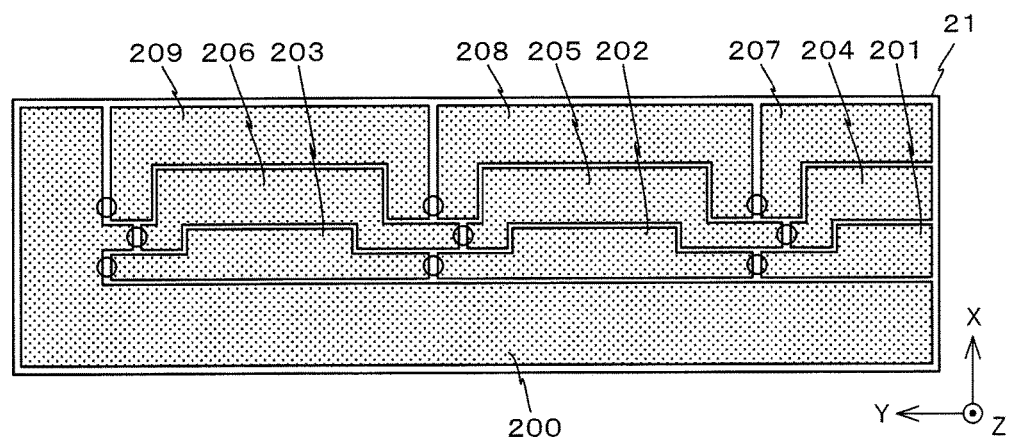
FIG. 13 is a diagram for explaining the manufacturing method of the light emitting module.

When the laser spot of the laser light is moved on the surface of the conductor layer 23 along the dashed lines illustrated in FIG. 12, the portion located near the moving path of the laser spot is melted and sublimates. Hence, as illustrated in FIG. 3, the mesh patterns 200-209 are cut out, while at the same time, the connection pads 200P formed adjacent to each other are electrically disconnected. According to the light emitting module 10, the pair of connection pads 200P is formed at each portion indicated by a circle (○) in FIG. 13.

Figure 14:
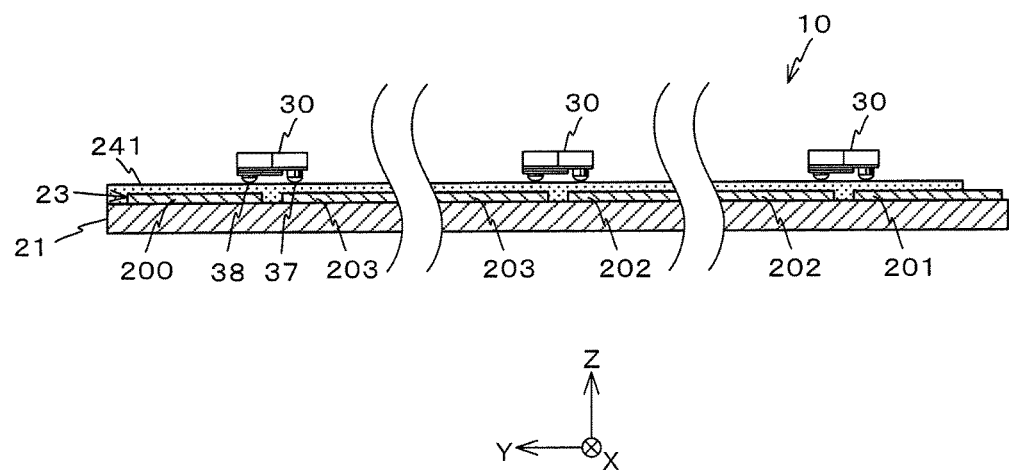
FIG. 14 is a diagram for explaining the manufacturing method of the light emitting module.

Next, as illustrated in FIG. 14, a thermosetting resin 241 is applied to the surface of the light transmissive film 21 on which the mesh patterns 200-209 are formed. This thermosetting resin 241 has the substantially equal thickness to the height of the bumps 37, 38 of the light emitting element 30. According to this embodiment, the thermosetting resin 241 is a resin film, and is disposed on the surface of the light transmissive film 21. An example material of the thermosetting resin 241 is an epoxy-based resin.

Next, the light emitting element 30 is disposed on the thermosetting resin 241. The light emitting element 30 is positioned in such a way that the connection pads 200P formed on the mesh patterns 200-209 are located right below the bumps 37, 38 of the light emitting element 30.

Figure 15:
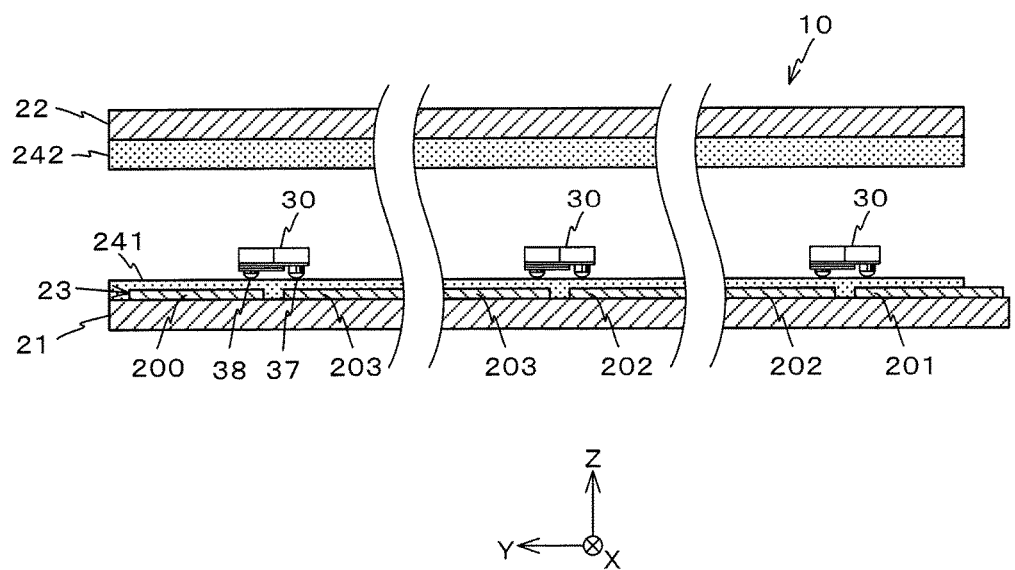
FIG. 15 is a diagram for explaining the manufacturing method of the light emitting module.

Subsequently, as illustrated in FIG. 15, the light transmissive film 22 that has a film formed of a thermoplastic resin 242 pasted on the lower surface is disposed on the upper-surface side of the light transmissive film 21. An example material of the thermoplastic resin 242 is an acrylic elastomer.

Next, the light transmissive films 21, 22 are both heated in a vacuum atmosphere and attached by pressure. Hence, the bumps 37, 38 formed on the light emitting element 30 pass completely through the thermosetting resin 241, and reach the conductor layer 23, and thus electrically connected to each of the mesh patterns 200-209. In addition, the softened thermoplastic resin 242 by heating is filled around the light emitting element 30 without any blank space, while at the same time, the thermosetting resin 241 is cured. Hence, as illustrated in FIG. 2, the thermosetting resin 241 and the thermoplastic resin 242 become the resin layer 24 that holds the light emitting element 30 between the light transmissive films 21, 22. The light emitting module 10 is finished through the processes explained above.

Figure 16:
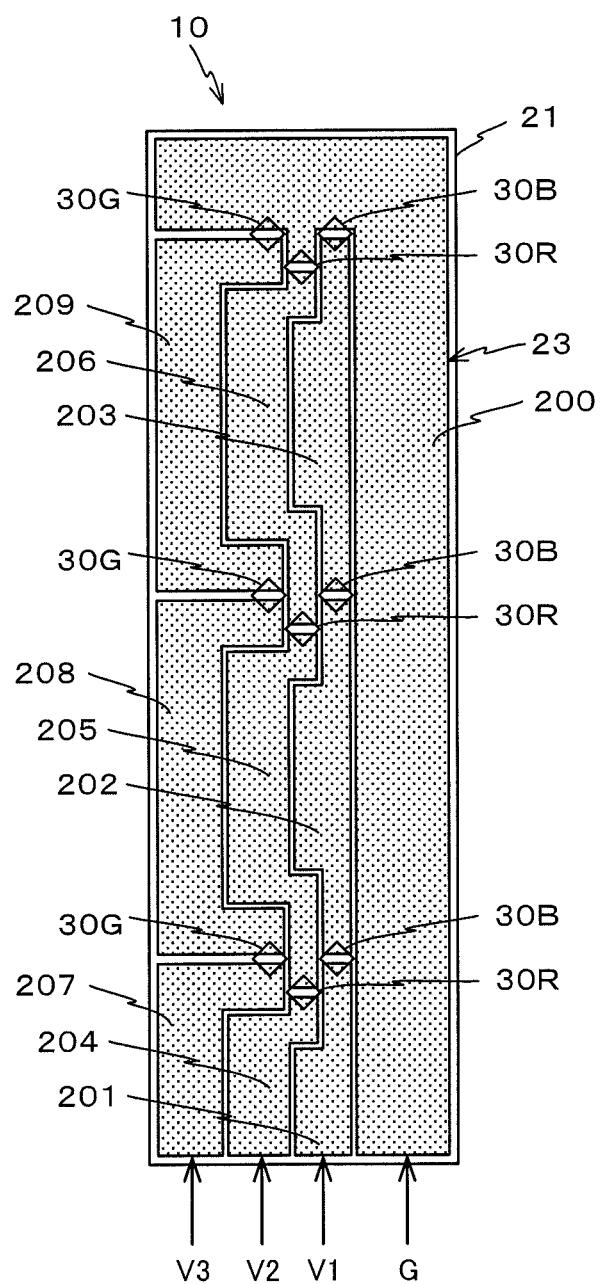
FIG. 16 is a diagram for explaining an operation of the light emitting module.

According to the light emitting module 10 employing the above structure, as illustrated in FIG. 16, with the mesh pattern 200 serving as a ground, voltages V1, V2, V3 are applied to the mesh patterns 201, 204, and 207, respectively. This causes each light emitting module 30R, 30G, and 30B to emit light. As illustrated in FIG. 9, the light emitting elements 30R, 30G, and 30B have the distance d2 which is between the adjacent light emitting elements and which is equal to or shorter than the length d1 of a side of the light emitting element 30. Accordingly, Red (R), Green (G), and Blue (B) lights emitted from the respective light emitting elements 30R, 30G, and 30B are mixed, and are visible for a human eye as if the light emitting module 10 is emitting white light.

Figure 17:
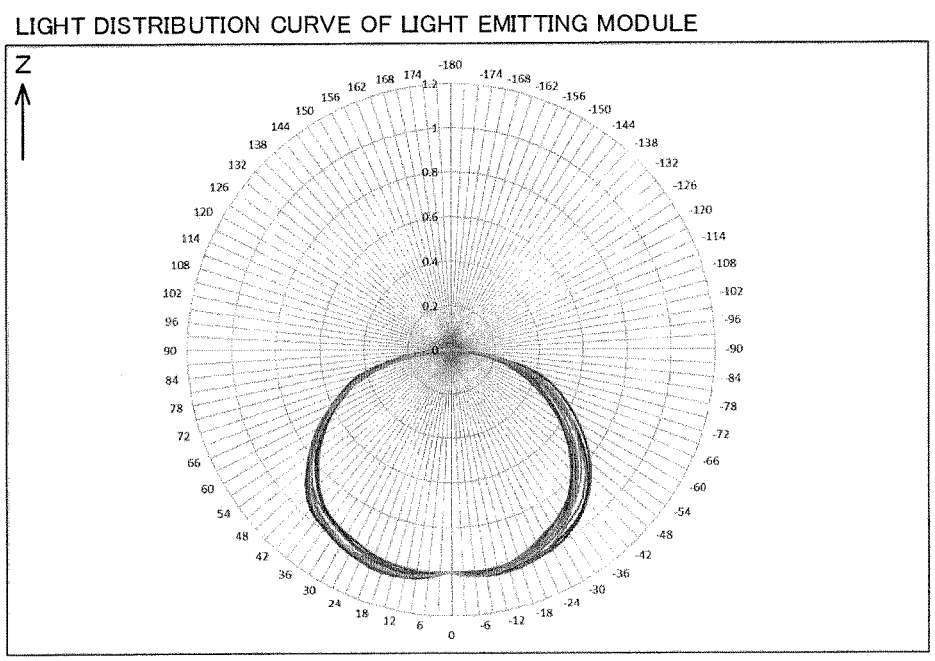
FIG. 17 is a diagram illustrating a light distribution curve of the light emitting module.

For example, FIG. 17 is a diagram illustrating a light distribution curve for light emitted downwardly from each light emitting element 30R, 30G, 30B. The distance d2 between the adjacent light emitting elements 30 is 1 mm. As illustrated in FIG. 17, areas surrounded by the respective light distribution curves of the light emitting elements 30R, 30G, and 30B mostly overlap. This shows that the lights emitted from the respective light emitting elements 30R, 30G, and 30B are mixed well.

Depending on the color mixing level, when the light from the light emitting module 10 is reddish or bluish, by adjusting the respective values of the voltages V1-V3, the color of light emitted from the light emitting module 10 is adjustable. In addition, by changing the respective voltages V1-V3 so as to adjust the respective intensities of Red (R), Green (G), and Blue (B) lights emitted from the light emitting modules 30R, 30G, and 30B, the light emitting module 10 is capable of emitting light with an intermediate color other than white. In this case, the intermediate color means the elementary color of Red (R), Green (G), and Blue (B) and the intermediate color thereof.

According to this embodiment, the light emitting element 30G that emits green light, and the light emitting element 30B that emits blue light are arranged adjacent to the light emitting element 30R that emits red light. In general, a human eye has a high sensitivity to red light. Hence, by arranging the light emitting elements 30G, 30B around the light emitting element 30R that emits red light, a person is capable of feeling as if the emitted light from the light emitting module 10 is uniform.

As explained above, according to this embodiment, the light emitting element 30R that emits red light, the light emitting element 30G that emits green light, and the light emitting element 30B that emits blue light are arranged adjacent to each other. Hence, the Red (R), Green (G), and Blue (B) lights emitted from the respective light emitting elements 30R, 30G, and 30B are mixed, enabling the light emitting module 10 to emit white and intermediate-color lights.

According to this embodiment, the three light emitting elements 30R are connected in series. Hence, the current flowing through each light emitting element 30R is uniform. This makes the light emitting intensity of each of the three light emitting elements 30R substantially uniform. Likewise, the three light emitting elements 30G and the three light emitting elements 30B are also connected in series, respectively. This makes the light emitting intensity of each of the three light emitting elements 30G substantially uniform, and the light emitting intensity of each of the three light emitting elements 30B substantially uniform. Hence, the light emitting elements 30 of the light emitting module 10 are facilitated to emit light at a uniform intensity.

According to this embodiment, as illustrated in FIG. 2, the respective light emitting elements 30R, 30G, and 30B are arranged between the pair of light transmissive films 21, 22. Hence, the light emitting module 10 can be made thin in comparison with a case in which the light emitting elements 30R, 30G, and 30B are arranged so as to be laid over in the normal line direction of the light transmissive films 21, 22.

According to this embodiment, the light emitting elements 30 are connected by the mesh patterns 201-209. Those mesh patterns 200-209 are each formed by a metal thin film that has a line width of substantially 10 μm. Accordingly, the sufficient light transmissivity of the light emitting module 10 and also the sufficient flexibility thereof are ensured.

According to this embodiment, the conductor layer 23 that includes the mesh patterns 200-209 is formed on the upper surface of the light transmissive film 21 in the pair of light transmissive films 21, 22. Hence, the light emitting module 10 according to this embodiment is made thinner than light emitting modules that have the conductor layers on both the upper surface of the light emitting element 30 and the lower surface thereof. Consequently, the flexibility of the light emitting module 10 and the light transmissivity thereof are improved.

According to this embodiment, the conductor layer 23 formed with the connection pads 200P is divided finely by laser light to form the mesh patterns 200-209. However, the mesh patterns 200-209 illustrated in FIG. 3 may be formed by photo-lithography.

In the above embodiment, the explanation has been given of an example case in which the resin layer 24 is formed of the thermosetting resin 241 and the thermoplastic resin 242 both in a sheet shape. However, the thermosetting resin 241 and the thermoplastic resin 242 may be applied to the light transmissive films 21, 22, and the resin layer 24 may be formed by those applied thermosetting resin 241 and thermoplastic resin 242.

In the above embodiment, the explanation has been given of an example case in which the resin layer 24 is formed of the thermosetting resin 241 and the thermoplastic resin 242. However, the resin layer 24 may be formed of a thermoplastic resin only. In addition, the resin layer 24 may be formed of a thermosetting resin only.

In the above embodiment, the explanation has been given of an example case in which the conductor layer 23 that includes the mesh patterns 200-209 is formed of a metal, such as copper (Cu) or silver (Ag). However, the conductor layer 23 may be formed of a transparent material with a conductivity like Indium Tin Oxide (ITO). In this case, the mesh patterns 200-209 illustrated in FIG. 1 is formed of a plane pattern (solid pattern) formed of a transparent conductive film with a uniform thickness.

Figure 18:
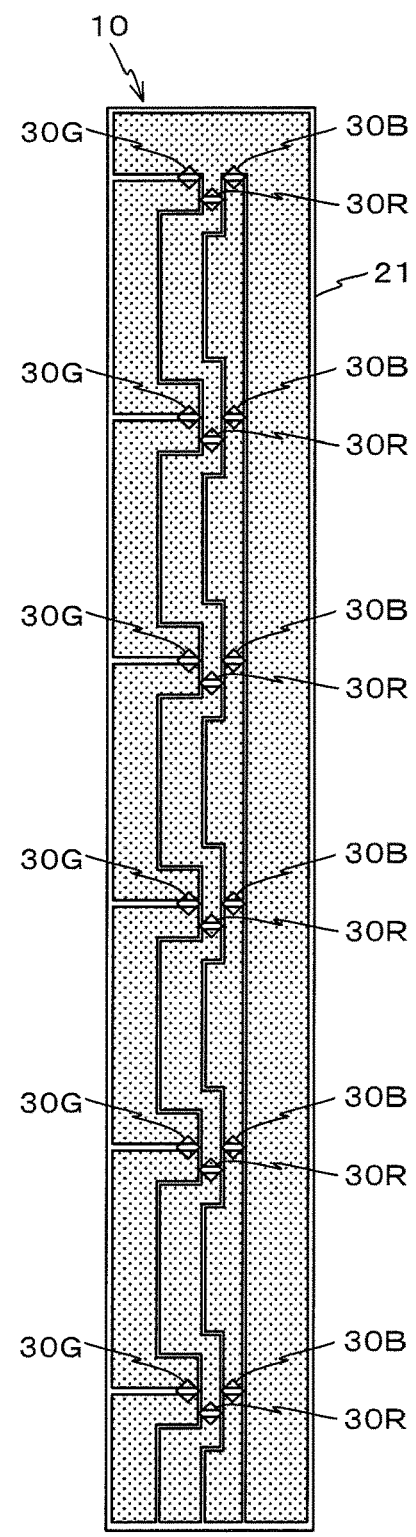
FIG. 18 is a diagram illustrating a modified example of the light emitting module.

In the above embodiment, as illustrated in FIG. 1, the explanation has been given of an example case in which the light emitting module 10 includes three groups each including the three light emitting elements 30R, 30G, and 30B arranged adjacent to each other. However, as illustrated in FIG. 18 as an example, the group including the three light emitting elements 30R, 30G, and 30B may be formed by equal to or greater than four. As illustrated in the figure, by changing the width of the conductor layer 23 at a region around the light emitting elements 30 that form a group, and at an area between the groups of the light emitting elements, the wiring resistance for the light emitting elements 30R, 30G, and 30B can be made uniform.

Figure 19:
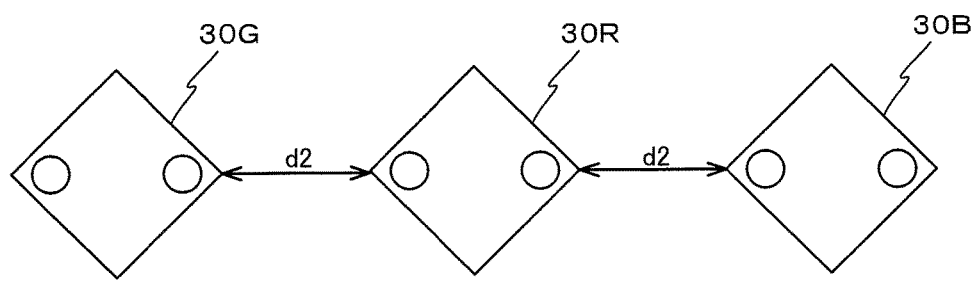
FIG. 19 is a diagram for explaining the modified example of the light emitting module.
Figure 20:
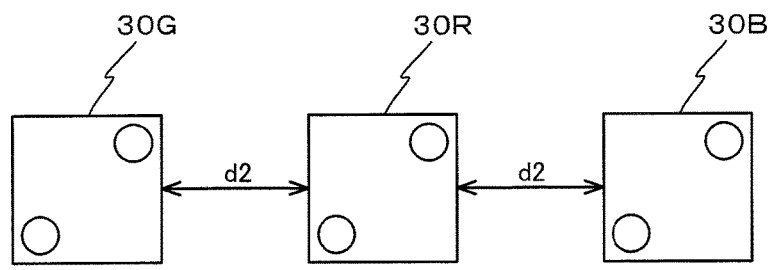
FIG. 20 is a diagram for explaining the modified example of the light emitting module.

In the above embodiment, as illustrated in FIG. 9, the explanation has been given of an example case in which the three light emitting elements 30R, 30G, and 30B are arranged in an L shape. However, as illustrated in FIG. 19 or 20 as an example, the three light emitting elements 30R, 30G, and 30B may be arranged linearly.

In the above embodiment, the explanation has been given of an example case in which the light emitting elements 30G, 30B are arranged adjacent to the light emitting element 30R. However, the arrangement sequence of the light emitting elements 30 is not limited to this case. For example, other light emitting elements 30 may be arranged adjacent to the light emitting element 30G or 30B.

Figure 21:
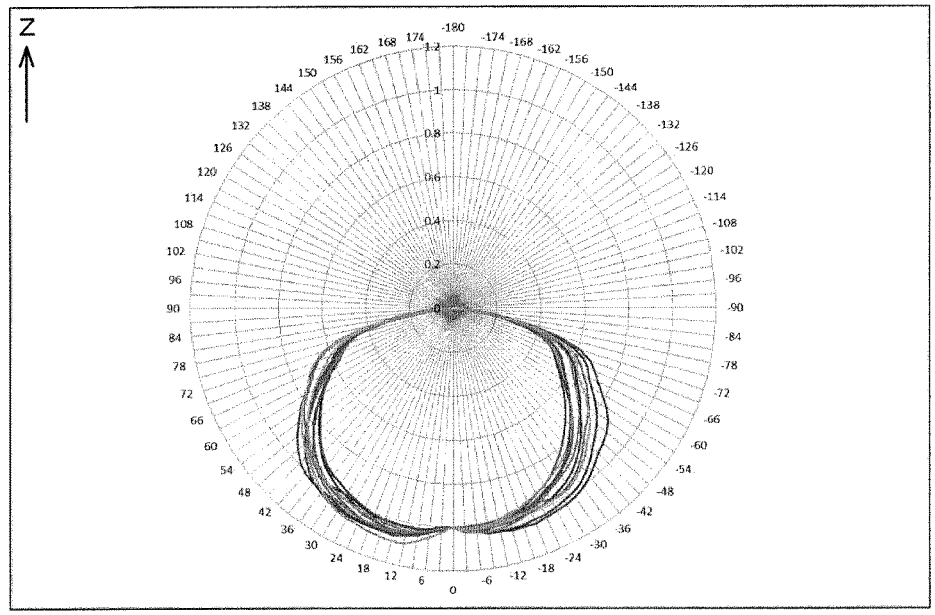
FIG. 21 is a diagram illustrating a light distribution curve of a light emitting module according to the modified example.

For example, FIG. 21 is a diagram illustrating a light distribution curve observed when the light emitting element 30R that emits red light, and the light emitting element 30G that emits green light are arranged adjacent to the light emitting element 30B that emits blue light. In this case, also, the distance d2 between the adjacent light emitting elements 30 is 1 mm. As illustrated in FIG. 21, areas surrounded by the respective light distribution curves of the light emitting elements 30R, 30G, and 30B mostly overlap. This shows that the lights emitted from the respective light emitting elements 30R, 30G, and 30B are mixed well.

When the light distribution curve of the light emitting module 10 (RGB arrangement) that has the light emitting element 30B emitting blue light and disposed at the center illustrated in FIG. 21 is compared with the light distribution curve of the light emitting module 10 (BRG arrangement) that has the light emitting element 30R emitting red light and disposed at the center illustrated in FIG. 17, in comparison with the overlap amount of light distribution curve in FIG. 17, the light distribution curves in FIG. 21 have a lower overlap amount, and the location of each light distribution curve varies. However, by setting the distance d2 from the center light emitting element 30B to the light emitting element 30R and the light emitting element 30G to 0.1 mm, as illustrated in FIG. 22 (RGB arrangement), the overlap amount can be increased.

Figure 22:
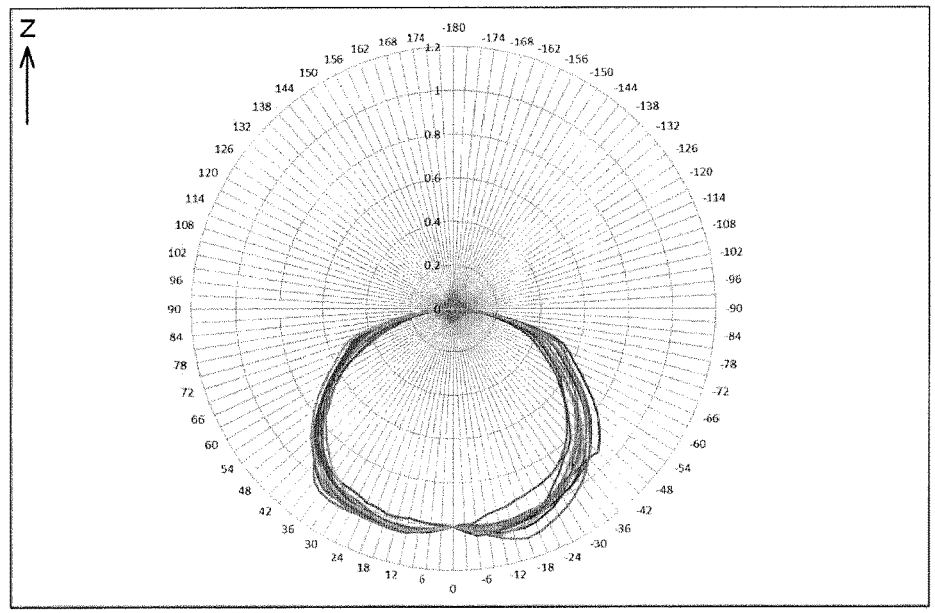
FIG. 22 is a diagram illustrating a light distribution curve of a light emitting module according to the modified example.

In addition, FIGS. 17, 21, and 22 show that when each distance d2 between the light emitting elements 30R, 30G, and 30B is set to be at least equal to or smaller than 1 mm, the colors of lights from the respective light emitting elements 30R, 30G, and 30B are sufficiently mixed. This confirms that the light emitting module 10 is visible for a human eye as if the light emitting module emits white light.

Figure 23:
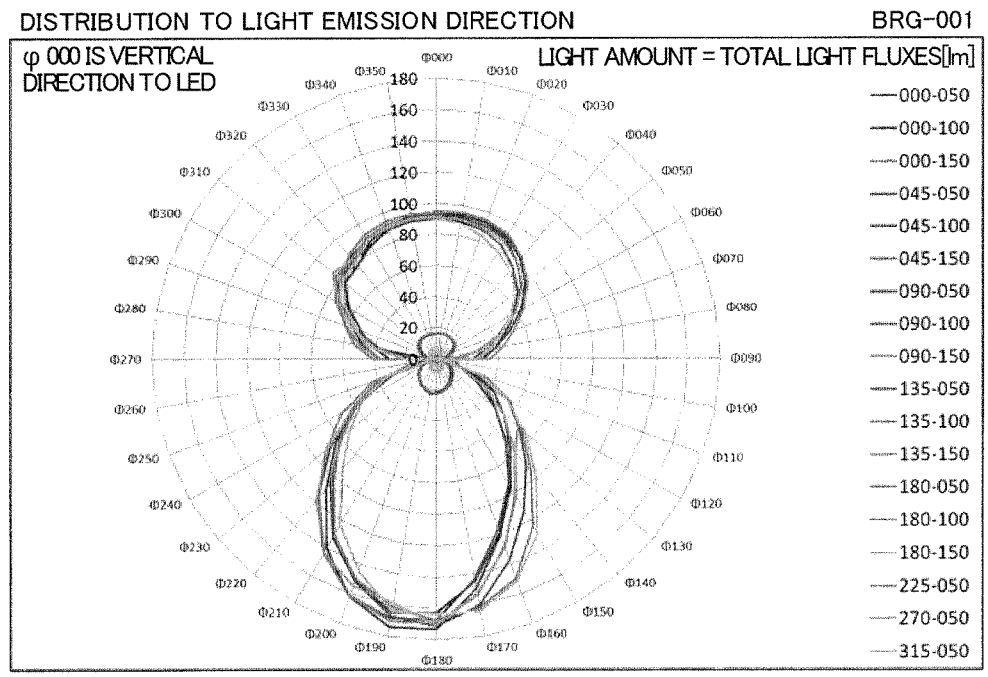
FIG. 23 is a diagram illustrating a (first) light distribution curve for three light emitting elements disposed around the light emitting element that emits red light.

FIG. 23 is a diagram illustrating a light distribution curve having undergone sampling when the light emitting elements 30R, 30G, and 30B are arranged on a straight line as illustrated in FIG. 19 at a pitch of 1 mm. The light distribution curves in FIG. 23 indicate the light intensity distribution of the light emitted above (+Z side) the light emitting element 30R, 30G, and 30B, and below (−Z side) such a light emitting element.

Figure 24:
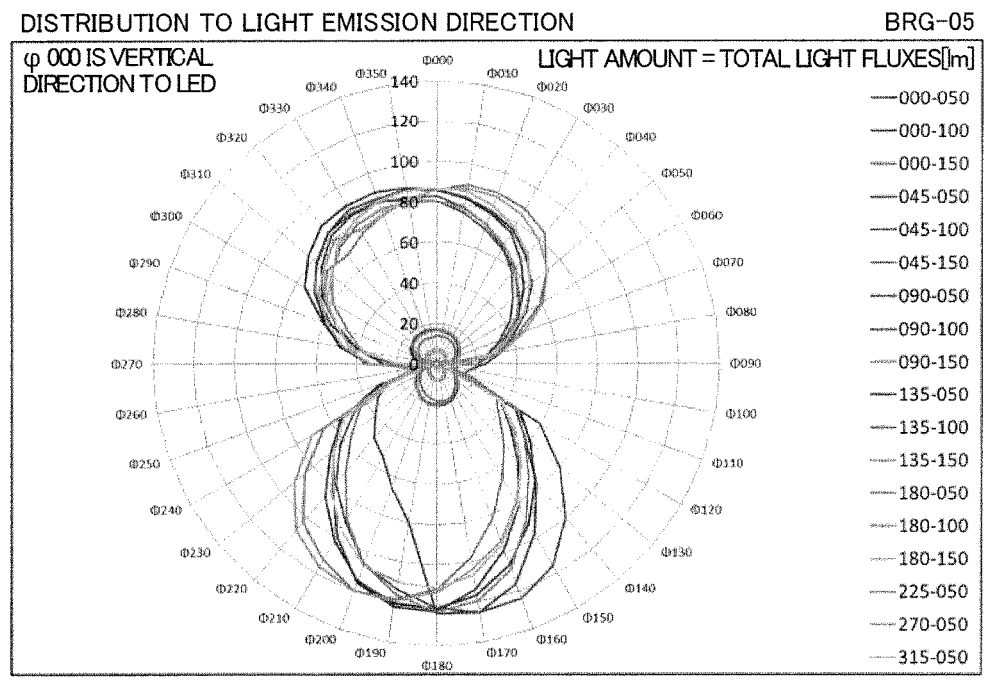
FIG. 24 is a diagram illustrating a (second) light distribution curve for three light emitting elements disposed around the light emitting element that emits red light.
Figure 25:
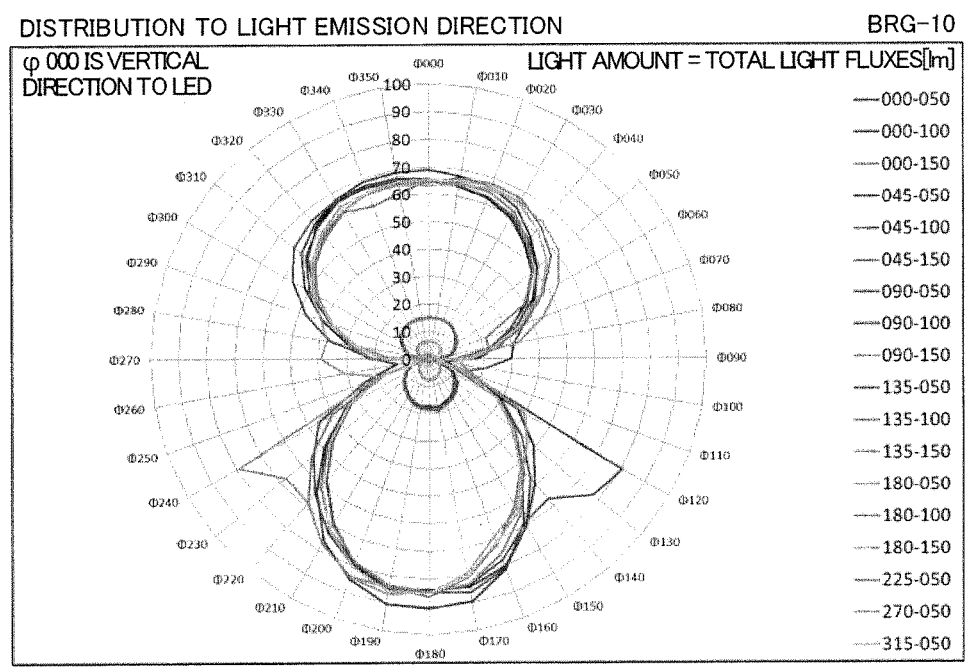
FIG. 25 is a diagram illustrating a (third) light distribution curve for three light emitting elements disposed around the light emitting element that emits red light.

FIG. 24 is a diagram illustrating a light distribution curve when the light emitting elements 30R, 30G, and 30B are arranged on a straight line like the arrangement in FIG. 23 at the pitch of 5 mm. In addition, FIG. 25 is a diagram illustrating a light distribution curve when the light emitting elements 30R, 30G, and 30B are arranged at the pitch of 10 mm. FIGS. 23-25 are for cases in which the light emitting elements 30G, 30B are arranged at both sides of the light emitting element 30R, respectively. The light emitting elements 30R, 30G, and 30B that had respective widths d1 of 0.3-0.4 mm were adopted. Measurements were made at three distances between the light emitting elements and the optical receiver of a light distribution measurement apparatus which were 50 mm, 100 mm, and 150 mm. In the figure, the outward light distribution curves are for the case in which the distance to the optical receiver was 50 mm, the light distribution curves appearing around 20 degrees relative to the center are for the case in which the distance was 100 mm, and the inward and small light distribution curves are for the case in which the distance was 150 mm. A product evaluation was made for the case with the strictest condition in which the distance between the light emitting element and the optical receiver was 50 mm.

As is clear from a comparison among FIGS. 23-25, the shorter the distance between the adjacent light emitting elements 30R, 30G, and 30B is, the more the overlap amount of light distribution curve increases. In addition, when the distance between the adjacent light emitting elements 30R, 30G, and 30B becomes equal to or greater than 10 mm, the lights emitted from the respective light emitting elements are reflected by the adjacent light emitting element, and thus the overlap amount of light distribution curve remarkably decreases.

Hence, it is preferable that the distance d2 between the adjacent light emitting elements 30R, 30G, and 30B should be equal to or smaller than 5 mm, more preferably, equal to or smaller than 1 mm.

Figure 26:
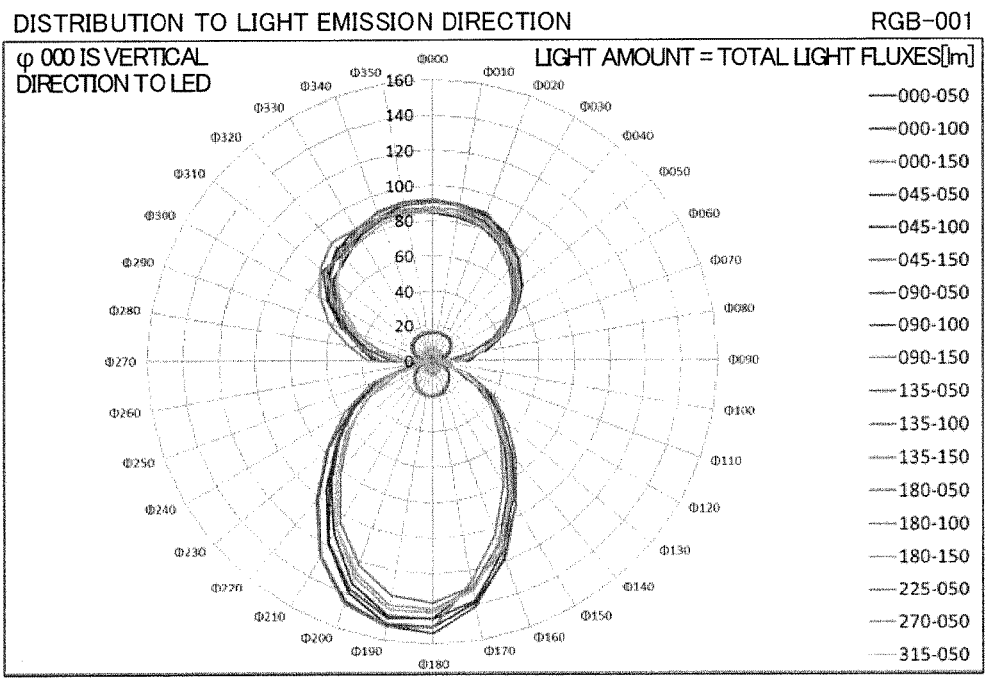
FIG. 26 is a diagram illustrating a (first) light distribution curve for three light emitting elements disposed around the light emitting element that emits green light.

FIG. 26 is a diagram illustrating a light distribution curve having undergone sampling when the light emitting elements 30R, 30G, and 30B are arranged as illustrated in FIG. 19 at the pitch of 1 mm. As for the arrangement of the light emitting elements 30R, 30G, and 30B, unlike the arrangement in FIG. 23, the light emitting elements 30R, 30B are arranged at both sides of the light emitting element 30G, respectively.

Figure 27:
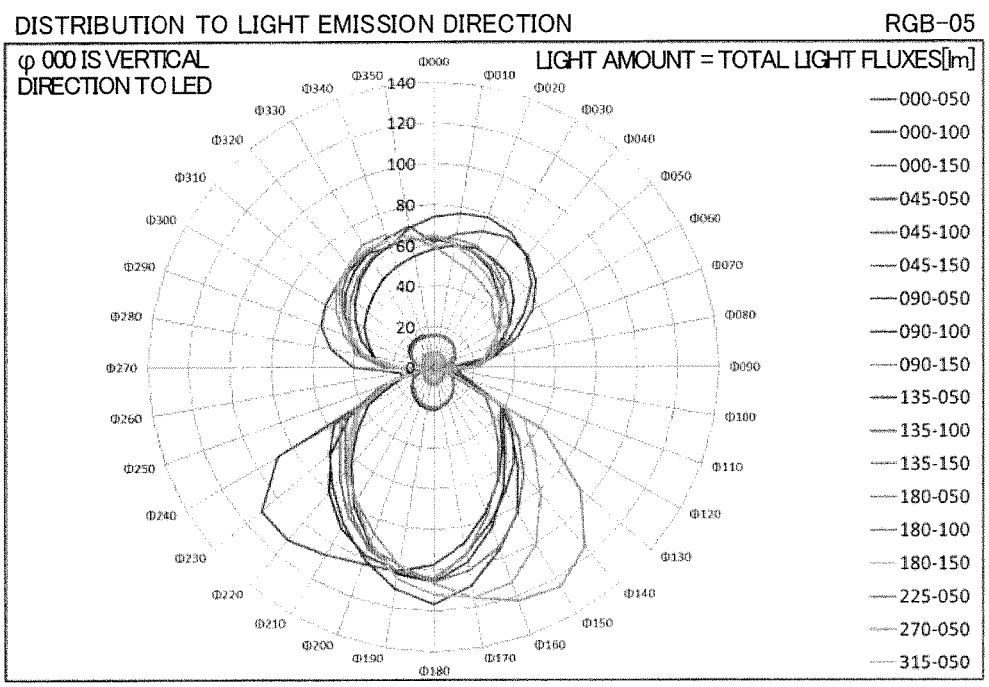
FIG. 27 is a diagram illustrating a (second) light distribution curve for three light emitting elements disposed around the light emitting element that emits green light.
Figure 28:
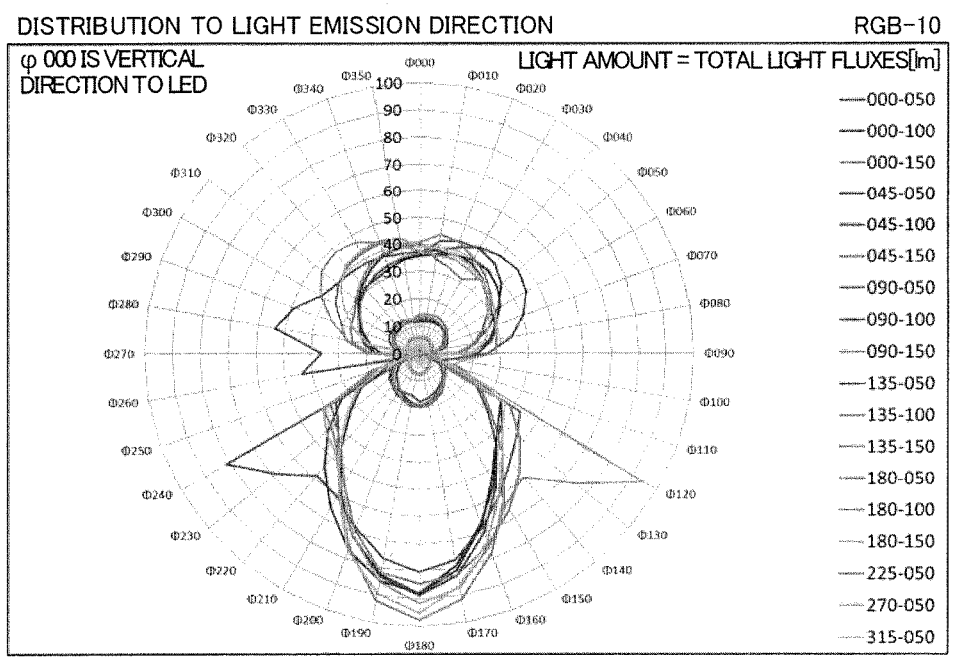
FIG. 28 is a diagram illustrating a (third) light distribution curve for three light emitting elements disposed around the light emitting element that emits green light.

FIG. 27 illustrates a light distribution curve when the light emitting elements 30R, 30G, and 30B are arranged like the arrangement in FIG. 26 at the pitch of 5 mm. In addition, FIG. 28 is a diagram illustrating a light distribution curve when the light emitting elements 30R, 30G, and 30B are arranged at the pitch of 10 mm.

There is little variability between the light distribution curve distribution in FIG. 23 and the light distribution curve distribution in FIG. 27. However, in comparison with FIG. 24, the light distribution curves in FIG. 27 have a large variability, and the overlap amount is small. Likewise, in comparison with the light distribution curves in FIG. 25, the light distribution curves in FIG. 28 have a large variability, and the overlap amount is small. Therefore, in the cases of FIGS. 26-28, it is preferable that the distance d2 between the adjacent light emitting elements 30R, 30G, and 30B should be equal to or smaller than 1 mm.

Figure 29:
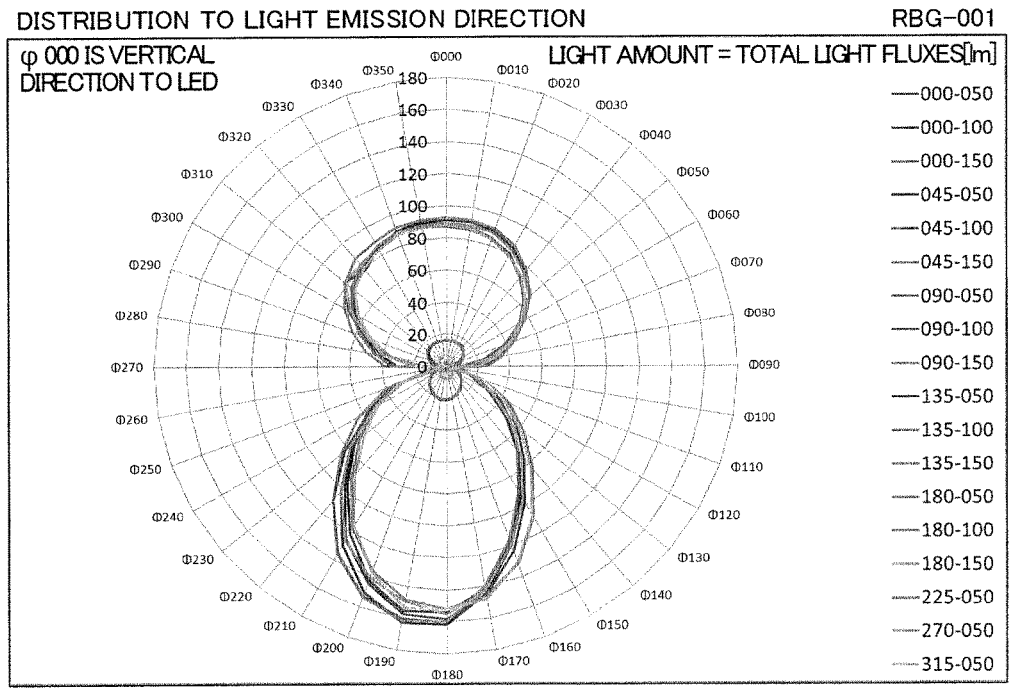
FIG. 29 is a diagram illustrating a (first) light distribution curve for three light emitting elements disposed around the light emitting element that emits blue light.

FIG. 29 is a diagram illustrating a light distribution curve having undergone sampling when the light emitting elements 30R, 30G, and 30B are arranged as illustrated in FIG. 19 at the pitch of 1 mm. As for the arrangement of the light emitting elements 30R, 30G, and 30B, the light emitting elements 30R, 30G are arranged at both sides of the light emitting element 30B, respectively.

Figure 30:
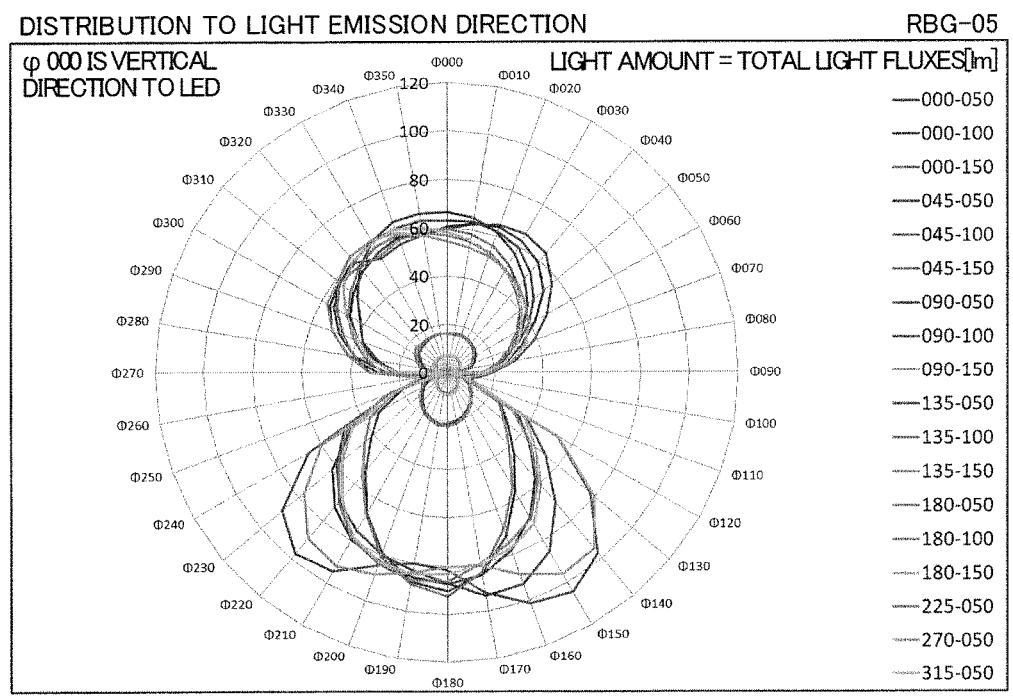
FIG. 30 is a diagram illustrating a (second) light distribution curve for three light emitting elements disposed around the light emitting element that emits blue light.

FIG. 30 illustrates a light distribution curve when the light emitting elements 30R, 30G, and 30B are arranged at the pitch of 5 mm. In addition, FIG. 31 is a diagram illustrating a light distribution curve when the light emitting elements 30R, 30G, and 30B are arranged at the pitch of 10 mm.

Figure 31:
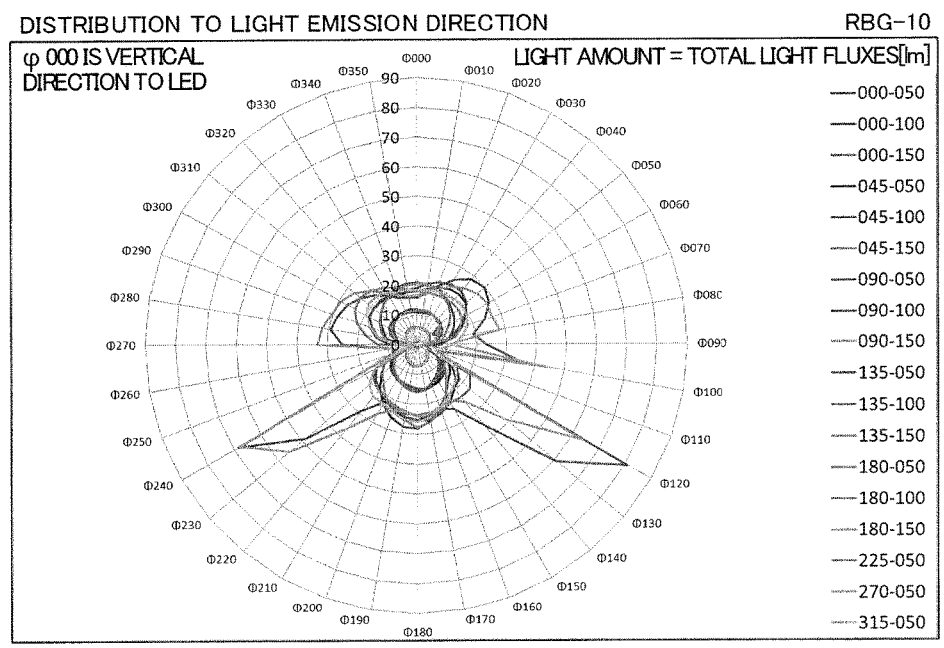
FIG. 31 is a diagram illustrating a (third) light distribution curve for three light emitting elements disposed around the light emitting element that emits blue light.

In the cases of FIGS. 29-31, the light distribution curves in FIG. 30 have a large variability, and the overlap amount is small. Therefore, it is preferable that the distance d2 between the adjacent light emitting elements 30R, 30G, and 30B should be equal to or smaller than 1 mm.

As explained above, as for the arrangement of the light emitting elements 30R, 30G, and 303, it is preferable that the light emitting elements 30G, 30B should be arranged at both sides of the light emitting element 30R, respectively, which emits red light and which is located at the center. In other words, it is preferable to arrange the light emitting elements 30G, 30B in such a way that, among the light emitting elements 30R, 30G, and 30B, the light emitting element 30R which emits red light is located at the center.

In the measurements of light distribution in FIGS. 23-31, the distance d2 that is equal to or smaller than 1 mm corresponds to substantially equal to or smaller than 3·d1 (d2≤3·d1), and an effect of color mixing is expectable (where 3·d1 means 3×d1).

In the measurements of light distribution in FIGS. 5, 7, 8, 17, 21-31, with the distance d2 between the adjacent light emitting elements being as a parameter, measurements were made within the range of d2=0.1-10 mm, and it was preferable that the d2 should be equal to or smaller than 1 mm.

When an application to a display device and an illuminating device is attempted, it is preferable that the distance to LEDs should be set in view of an expectation such that a person sees at a position close to the LEDs to some extent.

According to tests in which a manufactured light emitting module was actually held by a person with a hand and which was seen near the person's face, it was preferable that the distance d2 between the adjacent light emitting elements should be equal to or smaller than the width d1 of the light emitting element (d2≤d1). According to the tests actually seen by the naked eye, it was confirmed that when d2 is equal to or smaller than d1, the light emitting module is recognized as a dot light source with clear white light. A human eye has a unique wavelength characteristic, and has a high sensitivity to, for example, red. In addition, the light emission intensities of the light emitting elements 30R, 30G, and 30B vary. When, however, d2 is equal to or smaller than d1, it was confirmed that the light emitting module is recognized as a dot light source with clear white light and without a haze of a particular color. In addition, since processing of a wiring pattern of 0.1 mm is possible in terms of technology, the distance d2 between the adjacent light emitting elements can be equal to or smaller than 0.5·d1 (d2≤0.5·d1), such as 0.3·d1 or 0.4·d1.

Several embodiments of the present disclosure have been explained, but those embodiments are merely presented as examples, and are not intended to limit the scope of the present disclosure. Such novel embodiments can be carried out in other various forms, and various omissions, replacements, and modifications can be made thereto without departing from the scope of the present disclosure. Those embodiments and the modified forms thereof are within the scope and spirit of the present disclosure, and also within the scope of the invention as recited in appended claims and the equivalent range thereto.

The invention claimed is:

1. A light emitting module comprising:
a first insulation film with a light transmissivity;
a second insulation film disposed so as to face the first insulation film;
a first double-sided light emitting element disposed between the first insulation film and the second insulation film, and comprising a pair of first double-sided light emitting element electrodes on one surface of the first double-sided light emitting element;
a second double-sided light emitting element disposed between the first insulation film and the second insulation film adjacent to the first double-sided light emitting element, comprising a pair of second double-sided light emitting element electrodes on one surface of the second double-sided light emitting element, and emitting different light from the light emitted from the first double-sided light emitting element; and
a conductor pattern formed on a surface of the first insulation film, and connected to the respective electrodes of the first double-sided light emitting element and the second double-sided light emitting element.

2. The light emitting module according to claim 1, wherein a distance between the first double-sided light emitting element and the second double-sided light emitting element is equal to or smaller than a width of the first double-sided light emitting element.

3. The light emitting module according to claim 1, further comprising a third double-sided light emitting element disposed between the first insulation film and the second insulation film adjacent to the first double-sided light emitting element and also to the second double-sided light emitting element, the third double-sided light emitting element comprising a pair of third double-sided light emitting element electrodes on one surface of the third double-sided light emitting element, and emitting different light from the light emitted from the first double-sided light emitting element and also the light emitted from the second double-sided light emitting element.

4. The light emitting module according to claim 3, wherein a distance between the third double-sided light emitting element and the first or second double-sided light emitting element is equal to or smaller than a width of the first double-sided light emitting element.

5. The light emitting module according to claim 4, wherein the sizes of adjacent light emitting elements are different from each other, and the distance between the adjacent light emitting elements is equal to or less than a width of the larger light emitting element.

6. The light emitting module according to claim 4, wherein:
the first double-sided light emitting element and the second double-sided light emitting element are respectively adjacent to the third double-sided light emitting element,
the distance between the third double-sided light emitting element and the first double-sided light emitting element is about 0.1 mm, and the distance between the third double-sided light emitting element and the second double-sided light emitting element is about 0.1 mm, and the first double-sided light emitting element emits red light, the second double-sided light emitting element emits green light, and the third double-sided light emitting element emits blue light.

7. The light emitting module according to claim 4, wherein:
when viewing the light emitting module from a place separated from the light emitting module by 50 mm or more,
the first double-sided light emitting element and the second double-sided light emitting element are respectively adjacent to the third double-sided light emitting element,
the width of the double-sided light emitting elements are 0.3 mm to 0.4 mm, the distance between the third double-sided light emitting element and the first double-sided light emitting element is about 5 mm or less, and the distance between the third double-sided light emitting element and the second double-sided light emitting element is about 5 mm or less,
the first double-sided light emitting element emits green light, the second double-sided light emitting element emits blue light, and the third double-sided light emitting element emits red light.

8. The light emitting module according to claim 4, wherein:
the first double-sided light emitting element and the second double-sided light emitting element are respectively adjacent to the third double-sided light emitting element,
the distance between the third double-sided light emitting element and the first double-sided light emitting element is 1 mm or less, and the distance between the third double-sided light emitting element and the second double-sided light emitting element is 1 mm or less, and
the first double-sided light emitting element emits red light, the second double-sided light emitting element emits blue light, and the third double-sided light emitting element emits green light.

9. The light emitting module according to claim 4, wherein:
the first double-sided light emitting element and the second double-sided light emitting element are respectively adjacent to the third double-sided light emitting element,
the distance between the third double-sided light emitting element and the first double-sided light emitting element is 1 mm or less, and the distance between the third double-sided light emitting element and the second double-sided light emitting element is 1 mm or less,
the first double-sided light emitting element emits red light, the second double-sided light emitting element emits blue light, the third double-sided light emitting element emits green light, and
the first double-sided light emitting element, the second double-sided light emitting element, and the third double-sided light emitting element are disposed on a straight line in a state where the respective corners are adjacent.

10. The light emitting module according to claim 3, comprising a plurality of the first double-sided light emitting elements, a plurality of the second double-sided light emitting elements, and a plurality of the third double-sided light emitting elements,
wherein the plurality of the first double-sided light emitting elements is connected in series with each other, the plurality of the second double-sided light emitting elements is connected in series with each other, and the plurality of the third double-sided light emitting elements is connected in series with each other.

11. The light emitting module according to claim 3, wherein:
the first double-sided light emitting element and the second double-sided light emitting element are arranged adjacent to each other in a first axis direction, and
the second double-sided light emitting element and the third double-sided light emitting element are arranged adjacent to each other in a second axis direction orthogonal to the first axis.

12. The light emitting module according to claim 3, wherein the double-sided light emitting elements are arranged on a straight line.

13. The light emitting module according to claim 12, wherein the double-sided light emitting elements are arranged so that respective corners are adjacent to each other.

14. The light emitting module according to claim 3, wherein the conductor pattern comprises:
a folded back pattern connected to the first double-sided light emitting element, the second double-sided light emitting element, and the third double-sided light emitting element and folded back halfway, and
a plurality of connection patterns that are connected to the first double-sided light emitting element, the second double-sided light emitting element, and the third double-sided light emitting element respectively and the plurality of connection patterns has a width, in a vicinity of one of the double-sided light emitting elements, that is narrower than a width in a part that is spaced from said one of the double-sided light emitting elements.

15. The light emitting module according to claim 1, wherein the conductor pattern comprises a mesh pattern connected to the first double-sided light emitting element electrodes and the second double-sided light emitting element electrodes.

16. The light emitting module according to claim 1, wherein the first double-sided light emitting element has a different light distribution between the one surface and an other surface.

17. The light emitting module according to claim 1, wherein a distance between adjacent light emitting elements is equal to or smaller than 1 mm.

18. The light emitting module according to claim 1, wherein a distance between adjacent light emitting elements is equal to or smaller than a width of one of the light emitting elements, and is equal to or smaller than 1 mm.

19. The light emitting module according to claim 17, wherein the distance between the adjacent light emitting elements is 0.1-1 mm.

20. A light emitting module comprising:
a first insulation film with a light transmissivity;
a second insulation film with a light transmissivity disposed so as to face the first insulation film;
a light emitting element disposed between the first insulation film and the second insulation film, comprising an electrode provided on one surface of the light emitting element for supplying electricity to a semiconductor layer of the light emitting element, the light emitting element emitting light at substantially 360 degrees around a first axis orthogonal to the first insulation film and 360 degrees around a second axis orthogonal to the first axis;
a bump provided on the electrode; and
a conductor pattern formed on the first insulation film, and connected to the electrode of the light emitting element via the bump,
wherein a first light distribution emitted from the first-insulation-film side differs from a second light distribution emitted from the second-insulation-film side.

21. The light emitting module according to claim 20, wherein a light emission intensity in the second light distribution is higher than a light emission intensity in the first light distribution.

22. The light emitting module according to claim 20, comprising a plurality of the light emitting elements comprising a red light emitting element that emits red light, a green light emitting element that emits green light, and a blue light emitting element that emits blue light, the plurality of the light emitting elements being arranged adjacent to each other, and respective lights emitted from the plurality of light emitting elements are mixed.

23. The light emitting module according to claim 22, wherein the green light emitting element and the blue light emitting element are arranged with the red light emitting element being located at a center.

24. The light emitting module according to claim 20, comprising a plurality of the light emitting elements, a distance between the adjacent light emitting elements is equal to or smaller than a width of one of the light emitting elements.

25. The light emitting module according to claim 20, comprising a plurality of the light emitting elements, a distance between adjacent light emitting elements is equal to or smaller than 1 mm.

26. The light emitting module according to claim 20, comprising a plurality of the light emitting elements, a distance between adjacent light emitting elements is equal to or smaller than a width of one of the light emitting elements, and is equal to or smaller than 1 mm.

27. The light emitting module according to claim 20, comprising a plurality of the light emitting elements, a distance between adjacent light emitting elements is 0.1-1 mm.

28. The light emitting module according to claim 20, wherein the first light distribution shows that the light emission intensity of a portion corresponding to the electrode and the bump is weak.

29. A light emitting module comprising:
a first insulating film provided with a first conductive layer and having light transmissive property;
a first double-sided light emitting element having a pair of first double-sided light emitting element conductive members arranged to face the first conductive layer, the first double-sided light emitting element being electrically connected to the first conductive layer via the conductive members;
a second double-sided light emitting element having a pair of second double-sided light emitting element conductive members arranged to face the first conductive layer, and being electrically connected to the first conductive layer via the second double-sided light emitting element conductive members, the second double-sided light emitting element disposed 0.1 to 10 mm away from the first double-sided light emitting element and emits light of a color different from that of light emitted from the first double-sided light emitting element;
a second insulating film having light transmissive property and holding the first double-sided light emitting element and the second double-sided light emitting element; wherein
a part of a first emission curve of light emitted from the first double-sided light emitting element and the second double-sided light emitting element toward the first insulating film has a weak light emission intensity due to the influence of the first double-sided light emitting element conductive members and the second double-sided light emitting element conductive members, and a shape of a second emission curve of light emitted toward the second insulating film is different from a shape of the first emission curve,
a region surrounded by a light distribution curve of light emitted from the first double-sided light emitting element toward the first insulating film and a region surrounded by a light distribution curve of light emitted from the second double-sided light emitting element toward the first insulating film are substantially overlapped with each other, and
a region surrounded by a light distribution curve of light emitted from the first double-sided light emitting element toward the second insulating film and a region surrounded by a light distribution curve of light emitted from the second double-sided light emitting element toward the second insulating film are substantially overlapped with each other.

30. The light emitting module according to claim 29, wherein each of the pair of first double-sided light emitting element conductive members comprises an electrode and a bump formed on the electrode.

31. A light emitting module comprising:
a first insulation film provided with a first conductor pattern and having a light transmissivity;
a first double-sided light emitting element including a pair of electrodes and bumps arranged to face the first conductor pattern, the first double-sided light emitting element is electrically connected to the first conductor pattern via the electrodes and the bumps, a part of a first light distribution curve of light from the first double-sided light emitting element emitted to the first insulation film side indicates a portion where a light emission intensity is weak due to an influence of the pair of bumps, and the first light distribution curve from the first double-sided light emitting element is different from a second light distribution curve of light emitted from the first double-sided light emitting element to a side opposite to the first insulation film;
a second double-sided light emitting element including a pair of electrodes and bumps arranged to face the first conductor pattern, and emitting light of a color different from that of the first double-sided light emitting element, the second double-sided light emitting element is disposed 0.1 to 10 mm apart from the first double-sided light emitting element and is electrically connected to the first conductor pattern via the electrodes and the bumps, a part of a first light distribution curve of light from the second double-sided light emitting element emitted to the first insulation film side indicates a portion where a light emission intensity is weak due to an influence of the pair of bumps, and the first light distribution curve is different from a second light distribution curve of light emitted from the second double-sided light emitting element to a side opposite to the first insulation film; and a second insulation film having a light transmissivity and holding the first double-sided light emitting element and the second double-sided light emitting element, wherein a region surrounded by the first light distribution curve of the first double-sided light emitting element substantially overlaps with a region surrounded by the first light distribution curve of the second double-sided light emitting element, and a region surrounded by the second light distribution curve of the first double-sided light emitting element substantially overlaps with a region surrounded by the second light distribution curve of the second double-sided light emitting element.

* * * * *